US006750688B2

United States Patent
Takai

(12) United States Patent
(10) Patent No.: US 6,750,688 B2
(45) Date of Patent: Jun. 15, 2004

(54) SEMICONDUCTOR INTEGRATED CIRCUIT DEVICE AND DELAY-LOCKED LOOP DEVICE

(75) Inventor: Yasuhiro Takai, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/242,067

(22) Filed: Sep. 12, 2002

(65) Prior Publication Data

US 2003/0151433 A1 Aug. 14, 2003

(30) Foreign Application Priority Data

Sep. 19, 2001 (JP) ........................................ 2001-285509

(51) Int. Cl.[7] ............................................... H03L 7/06
(52) U.S. Cl. ........................................ 327/158; 327/160
(58) Field of Search ................................. 327/144–147, 327/149–153, 155–156, 158–161, 407; 375/376

(56) References Cited

U.S. PATENT DOCUMENTS 6,181,174 B1 * 1/2001 Fujieda et al. ............... 327/158
6,342,796 B2 * 1/2002 Jung ........................... 327/141
6,501,309 B1 * 12/2002 Tomita ........................ 327/158
6,509,775 B2 * 1/2003 Saeki ........................... 327/271

FOREIGN PATENT DOCUMENTS

JP    P 3061126    4/2000    ....... H03K/19/0185

* cited by examiner

Primary Examiner—My-Trang Nuton
(74) Attorney, Agent, or Firm—Hayes Soloway P.C.

(57) ABSTRACT

The present invention provides a DLL and a semiconductor integrated circuit device of reduced power consumption suited for use in equipment that complies with DDR-II specifications. It also provides a DLL and a semiconductor integrated circuit device in which the occurrence of hazards at the time of tap changeover is suppressed, thereby preventing a deviation in output timing as well as malfunction. In accordance with one aspect of the present invention, a delay-locked loop device is provided for adjusting delay times of serially connected first and second delay lines in such a manner that a signal obtained by delaying an input signal by the first and second delay lines is in phase with the input signal, thereby outputting, from the first delay line, a signal that is the result of delaying the input signal by one half cycle of the input signal.

33 Claims, 21 Drawing Sheets

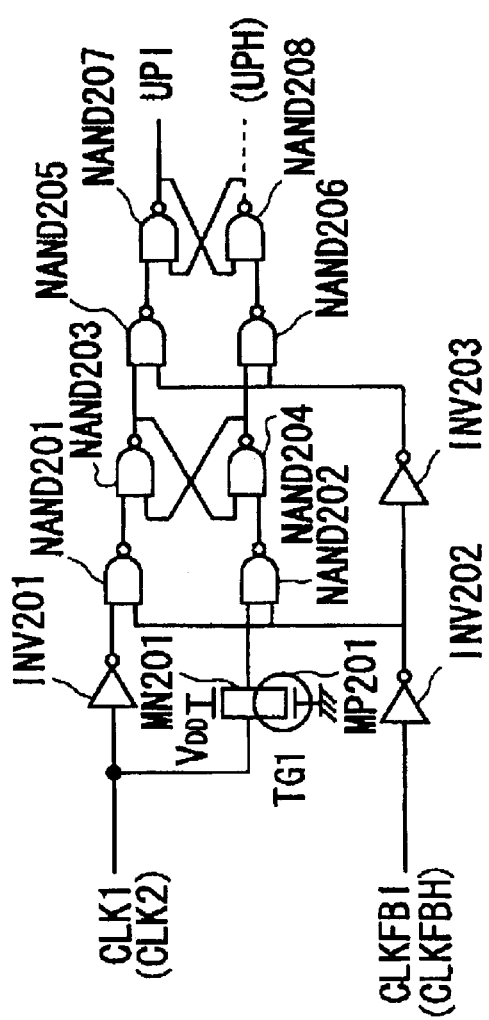
FIG. 9A
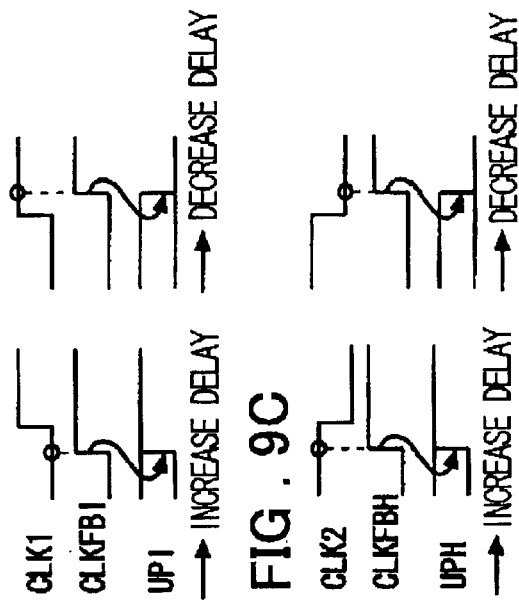
FIG. 9B
FIG. 9C

SEMICONDUCTOR INTEGRATED CIRCUIT DEVICE AND DELAY-LOCKED LOOP DEVICE

FIELD OF THE INVENTION

This invention relates to a semiconductor integrated circuit device and, more particularly, to a delay-locked loop (DLL) and a semiconductor integrated circuit device equipped with the DLL.

BACKGROUND OF THE INVENTION

A DDR (Double Data Rate)-I-SDRAM (Synchronous Dynamic Random-Access Memory) is designed to perform data transfer at a transfer rate of 200 to 300 Mbps (megabits per second) with respect to an input clock having a frequency of 100 to 166 MHz. Design specification is such that data input is synchronized to both rising and falling edges of an input clock signal. The desired specifications can be achieved with a DLL of minimal structure by passing the entered clock through a single delay line as is.

FIG. 18 is a diagram illustrating an example of a DLL (Delay Locked Loop) in compliance with DDR specifications, and FIG. 19 is a diagram illustrating the timing operation of this DLL.

Referring to FIG. 18, the DLL 3A is equipped with an input buffer 1, the inputs to which are mutually complementary clock signals CLK and CLKB transmitted in a differential mode, for outputting a clock signal CLK1 of single-phase (single-end) mode, and includes a delay line 31 for delaying and outputting the clock signal CLK1 input thereto from the input buffer 1. The delay line 31 outputs the delayed signal from one output tap selected from among a plurality of output taps (not shown) whose delay times differ from one another, thereby making it possible to change the delay time.

Provided are a multiplexer (MUX) 4, which receives two items of data read out of a memory-cell array (not shown), for selecting the data using the signal CLKOE, which is output from the delay line 31, as a clock for data output; an output buffer 5, which receives the output signal of the multiplexer 4, for delivering this signal to a data output terminal as a data output signal DQj; a dummy multiplexer (MUX) 36 having a delay time identical with that of the multiplexer 4 and having the output signal CLKOE of the delay line 31 input thereto as a selection signal for outputting a HIGH- or LOW level signal; a dummy buffer 37 having a delay time identical with that of the output buffer 5 and having the output of the dummy multiplexer 36 input thereto for outputting complementary clock signals RCLK and RCLKB; a dummy buffer 38 having a delay time identical with that of the input buffer 1 and having the clock signals RCLK, RCLKB, which have been transmitted in the differential mode, input thereto for outputting a single-end clock signal CLKFBI; a phase detector 33, to which the output signal CLK1 of the input buffer 1 and the output signal CLKFBI of the dummy buffer 38 are input, for detecting the phase difference between the signals CLK1 and CLKFBI; and a counter 34 for counting up or down in accordance with phase lead/lag depending upon the result of phase detection by the phase detector 33. Fixed values of the HIGH level (VDD potential) and LOW level (VSS potential) are supplied as data to the dummy multiplexer 36, which selects and outputs one of these values using the entered signal CLKOE as the selection signal.

In the DLL 3A, the output tap of the delay line 31 is changed over based upon the output signal of the counter 34 in such a manner that the output clock signal CLK1 of input buffer 1 and output signal CLKFBI of dummy buffer 38 will agree, thereby adjusting the delay time of the DLL. As shown in the timing chart of FIG. 19, the output signal DQj of the DDR-SDRAM is locked (synchronized) to the clock CLK.

Referring to FIG. 19, the timing of the rising edge of signal CLKOE is delayed by delay time td0 of the delay line 31 relative to the timing of the rising edge of output clock CLK1 of input buffer 1 [see arrow (1) in FIG. 19]. The rising edge of the signal CLKFBI is delayed relative to the timing of the rising edge of signal CLKOE by time td1+td2+td3, which is the sum of delay times td3, td2, and td1 of dummy multiplexer 36 and buffers 37 and 38, respectively [arrow (3) in FIG. 19].

Control is exercised in such a manner that the timing of the rising edge of signal CLKFBI will coincide with the timing (delayed by the delay time td1 of the input buffer 1 relative to the starting timing of the cycle of clock CLK) of the rising edge of clock CLK1 prevailing one cycle after the clock CLK from which the present signal CLKFBI originates.

Consequently, the timing of the rising edge of signal CLKFBI becomes $$tCK+td1$$

with the timing of the rising edge of input clock CLK (clock cycle=tCK) serving as the reference.

Accordingly, the timing of the rising edge of clock CLKOE becomes $$tCK+td1-(td1+td2+td3)=tCK-td2-td3$$

In the data output propagation path through the multiplexer 4, the propagation delay time from the rising edge of signal CLKOE to the output, of multiplexer 4 is td3 and the propagation delay time of the output buffer 5 is td2 [arrow (4) in FIG. 19] and therefore the output timing of the data output signal DQj is $$(tCK-td2-td3)+td3+td2=tCK$$

In other words, the timing of the rising edge of clock CLK (the starting point of the clock cycle) and the timing at which the data output signal DQj is delivered agree.

Similarly, the timing of the falling edge of signal CLKOE is delayed by delay time td0 of the delay line 31 relative to the timing of the falling edge of output clock CLK1 of input buffer 1 [see arrow (2) in FIG. 19]. The timing of the falling edge of the signal CLKFBI lags behind the timing of the rising edge of this signal by the pulse width of clock CLK1 [arrow (5) in FIG. 19]. The next data output signal DQj is delivered at the falling edge of the signal CLKOE, and the timing thereof coincides with the timing of the falling edge of clock CLK (the rising edge of clock CLKB). The DLL 3A having the construction shown in FIG. 18 is a circuit that adjusts and matches the phases of the input clock and output data and may also be referred to as an "input/output-compensating DLL".

The specifications of a DDR-II-SDRAM are such that an even higher speed is attained, namely a clock frequency of 200 to 300 MHz (a data transfer rate of 400 to 600 mbps). In order to improve the operating margin of a memory controller, a design (Duty Cycle Correction, abbreviated to "DCC") that synchronizes the input clock CLK to phases of 0 and 180 degrees is currently under study.

As shown by way of example in FIG. 20, a DLL in compliance with the specifications of a DDR-II-SDRAM is constituted by a total of four delay lines, namely a delay line (which corresponds to delay line 31 in FIG. 18) for 0° propagation as well as a delay line 32 for 180° propagation and two delay lines 21 and 22 for generating a 180° phase difference. In other words, this DLL circuit has a DLL 2B for generating tCK/2 and a DLL 3B for input/output compensation.

Referring to FIG. 20, the tCK/2 generating DLL 2B includes the delay line 21, which receives the clock signal CLK1 from the input buffer 1 having the clocks CLK and CLKB applied thereto, for varying the delay time of its output signal CLKHF by changing over the output tap; the delay line 22, which receives the clock signal CLKHF from the delay line 21, for varying the delay time of its output signal CLKFBH by changing over the output tap; a phase detector 23, which receives the clock CLK1 and the output signal CLKFBH of delay line 22, for detecting the phase difference between these two signals; and a counter 24 for counting up or down in accordance with phase lead/lag depending upon the result of phase detection by the phase detector 23. The output taps of the delay circuits 21 and 22 are selected in such a manner that the timings of the rising edges of the signals CLKFBH and CLK1 (CLK1 one cycle later than the cycle of clock CLK1 at which the signal CLKFBH was generated, where the clock period of the clock CLK is tCK) input to the phase detector 23 will coincide. That is, if the timing of the rising edge of signal CLKFBH obtained by delaying the clock signal CLK1 by td in delay line 21 and further by td in delay line 22 coincides with the timing of the rising edge of clock signal CLK1, then we have $$td+td=tCK$$

as a result of which the delay time td of each of the delay lines 21 and 22 is $$td=tCK/2.$$

The timing of the rising edge of clock signal CLKHF output from the tCK/2 generating DLL 2B is delayed by one-half of the clock cycle tCK relative to the timing of the rising edge of clock signal CLK1, whereby a phase difference of 180° is produced.

The input/output-compensating DLL 3B includes the delay line 31, which receives the clock signal CLK1 that is the output of the input buffer 1, for varying the delay time of its output signal OUTR by changing over the output tap; the delay line 32, which receives the output signal CLKHF of the delay line 21, for varying the delay time of its output signal OUTF by changing over the output tap; a multiplexer (MUX) 35B, which receives the outputs OUTR and OUTF of the delay lines 31 and 32, for producing the output signal CLKOE whose pulse rising-edge and falling-edge timings are decided by the timings of the rising edges of signals OUTR and OUTF; the multiplexer (MUX) 4, which receives the output signal CLKOE (data-output clock) of the multiplexer 35B as a selection signal, for selectively outputting two items of data per clock cycle of the clock CLK; the output buffer 5, which receives the output of the multiplexer 4, for outputting this signal as signal DQj; the dummy multiplexer 36 having a delay time identical with that of the multiplexer 4 and having the output signal CLKOE of multiplexer 35B input thereto; the dummy buffer 37 having a delay time identical with that of the output buffer 5 and having the output of the dummy multiplexer 36 input thereto for outputting complementary clock signals RCLK and RCLKB; the dummy buffer 38 having a delay time identical with that of the input buffer 1 and having the complementary signals RCLK and RCLKB input thereto for outputting the single-end clock signal CLKFBI; the phase detector 33, which receives the output signal CLK1 of the input buffer 1 and the output signal CLKFBI of the dummy buffer 38, for detecting the phase difference between the signals CLK1 and CLKFBI; and the counter 34 for counting up or down depending upon the output of the phase detector 33. The output taps of the delay lines 31 and 32 are changed over by the output of the counter 34, whereby delay time is adjusted. The HIGH and LOW fixed values are input as data to the dummy multiplexer 36, which selects and outputs one of these values using the entered signal CLKOE as the selection signal.

FIG. 21 is a diagram useful in describing the timing operation of the circuit illustrated in FIG. 20. The operation of the circuit depicted in FIG. 20 will be described with reference to FIG. 21.

The delay line 31, which receives the output clock signal CLK1 of delay line 21, outputs the signal OUTR obtained by delaying the clock signal CLK1 by the time td0 [see arrow (2) in FIG. 21]. The delay line 32, which receives the signal CLKHF obtained by delaying the clock CLK1 by tCK/2 [see arrow (1) in FIG. 21], produces the output OUTF obtained by delaying the signal CLKHF by td0 [arrow (3) in FIG. 21]. The output signal CLKOE of multiplexer 35B rises to the HIGH level [arrow (4) in FIG. 21] at the rising edge of signal OUTR and falls to the LOW level [arrow (5) in FIG. 21] at the rising edge of signal OUTF.

Selection of data in the multiplexer 4 is carried out at the rising and falling edges of the signal CLKOE, and the output of signal DQj delivered from the output buffer 5 is timed to occur in one-half cycle units of cycle tCK of clock signal CLK. This operation will now be described.

The clock CLKOE, which is the data output clock delivered from the multiplexer 35B, rises (at the timing of the rising edge of signal OUTR) upon being delayed by delay time td0 of delay line 31 from the rising edge of output clock CLK1 of input buffer 1; it has a pulse width of $$td0+tCK/2-td0=tCK/2$$

The timing of the falling edge of signal CLKOE is $$tCK/2+td0$$

from the rising edge of the output clock CLK1 of input buffer 1 (i.e., the timing is the rising edge of signal OUTF).

The rising edge of the signal CLKFBI is delayed relative to the timing of the rising edge of signal CLKOE by time td1+td2+td3, which is the sum of delay times td3, td2, td1 of dummy multiplexer 36 and buffers 37, 38, respectively [arrow (6) in FIG. 20].

Control is exercised in such a manner that the timing of the rising edge of signal CLKFBI will coincide with the timing of the rising edge of clock CLK1 prevailing n cycles (three cycles in FIG. 21) after the clock CLK from which the present signal CLKFBI originates (where CLK1 is delayed by the delay time td1 of input buffer 1 relative to the starting timing of the cycle of clock CLK). Consequently, the timing of the rising edge of signal CLKFBI becomes $$ntCK+td1$$

with the timing of the rising edge of input clock CLK (clock cycle=tCK) serving as the reference.

Accordingly, the timing of the rising edge of clock CLKOE becomes $$ntCK+td1-(td1+td2+td3)=ntCK-td2-td3$$

In the data output propagation path through the multiplexer 4, the propagation delay time from the rising edge of signal CLKOE to the output of multiplexer 4 is td3 and the propagation delay time of the output buffer 5 is td2 [arrow (7) in FIG. 21]. The output timing of the data output signal DQj, therefore, is $(ntCK-td2-td3)+td3+td2=ntCK$ In other words, the starting point of the clock cycle of clock CLK (the timing of the rising edge of clock CLK) and the timing at which the data output signal DQj is delivered agree.

Further, the timing of the falling edge of signal CLKOE lags behind the timing of the rising edge thereof by tCK/2, so that the timing of the falling edge of signal CLKOE is $(ntCK-td2-td3+tCK/2)+td3+td2=ntCK+tCK/2$ Accordingly, the output timing of the second data output signal DQj is tCK/2 from the starting point of the clock cycle of clock signal CLK.

In the data output path through the multiplexer 4, the propagation delay time from the rising edge is td3, and the propagation delay time of the output buffer 5 is td2 [arrow (9) in FIG. 21], and hence we have as the output timing of the second data output signal DQj, $(ntCK-td2-td3+tCK/2)+td3+td2=ntCK+tCK/2$ Accordingly, the output timing of the second data output signal DQj is at the timing which is tCK/2 delayed from the starting point of clock cycle of the clock CLK.

Thus, as shown in FIG. 21, duty correction of clocks CLK/CLKB the duty ratios of which differ by 50% is carried out and an output operation. having a data window of 50% is performed.

The delay lines 21, 22, 31, and 32 have a structure of the kind shown in FIG. 14. Each delay line has taps D1, D2 and D3, and switches (tri-state inverters or CMOS transfer gates) are connected between respective ones of the taps and an output node. One switch is turned on and the others are turned off by tap control signals C1, C2 and C3, whereby the tap corresponding to the ON switch is selected.

The duty cycle correction function will be described in greater detail. As mentioned above, the tCK/2 generating DLL 2B of FIG. 20 acts as a duty correction circuit (DCC).

Reference will be had to FIG. 17 to describe a system configuration, which is driven by a clock signal supplied from a clock generating source 52, having a plurality of clock-synchronization-type memories $51_i$ to $51_n$ that output read-out data DQj to a memory controller 50 in sync with the clock. FIG. 16 is a diagram useful in comparing and describing a case devoid of the DCC function and a case having the DCC function.

Even if a near-end clock signal CLK from clock generating source 52 has a duty ratio of 50%, the duty ratio of the clock signal at the far end will deviate from 50% owing to the presence of clock skew ($\alpha$).

If the data window of DQj at the near end fluctuates by 62% in the case of a clock-synchronization-type memory not having the DCC function, then the data window of data DQj at the far end will exhibit a fluctuation of 50% $\pm(\alpha+\beta)$ owing to the presence of clock skew.

By contrast, with a clock-synchronization-type memory having the DCC function, the duty ratio of the clock is made 50% and the duty window of DQj at the near end becomes 50%. Even if the data window exhibits a fluctuation of $\beta$%, the data window of data DQj at the far end will exhibit a fluctuation of 50%$\pm\beta$ and the effects of clock skew can be eliminated or reduced.

SUMMARY OF THE DISCLOSURE

According to the specifications of a DDR-II-SDRAM, the operating cycle is 3.3 ns, which is half that of a DDR-I-SDRAM, and the pulse width of the clock signal that propagates through the interior of the DLL of a delay line or the like is a maximum 1.7 ns. This is a small value that is half that of the DDR-I-SDRAM. Consequently, if the threshold value of a transistor constituting the delay line of the DLL rises and the waveform of a rising edge becomes deformed, the output signal will begin to decay before it reaches its peak. This makes it difficult to maintain a high timing precision.

In addition, a DDR-II-SDRAM is provided with four delay lines, so that the delay-line operating current is four times the delay-line current of a DDR-I-SDRAM. The result is an increase in power consumption.

Next, assume that the delay line having the structure shown in FIG. 14 has cascade-connected inverters INV11, INV12, . . . to provide the output taps. In FIG. 14, two serially connected inverters compose a unit delay line. Tri-state inverters INV17, INV18, and INV19 (or transfer gates) connected between respective ones of the taps and the output node are output-enabled or output-disabled (the latter meaning that the output attains a high impedance) in accordance with the logic values of the tap selection signals C1, C2, and C3, respectively, from a counter. Output taps are thus selected by the tap selection signals C1, C2, and C3 and the clock signal is output from the tap selected.

In FIGS. 18 and 20, the phase detector 33 (23) detects the lead/lag phase relationship between the clock signal CLKFBI (CLKFBH) and the reference clock signal CLK1 and updates the counter 34 (24). In addition, in order to prevent erroneous decisions from being made before and after the device is powered down, for example, the phase detector 33 (23) performs detection based upon the timing of signal CLKFBI (CLKFBH). If the tap is changed over at the timing at which the signal that propagates through the interior of the delay line is output from the tap, a hazard or abnormal pulse may be produced in the data-output clock signal CLKOE or a malfunction may occur. The reason for this is that the count in counter 34 (24) is updated and the tap is changed over at the transition timing of the signal CLKFBI (CLKFBH).

FIG. 15 is a diagram useful in describing operation at tap changeover of the delay line shown in FIG. 14. If, during the time a signal advances from D1 to D2, as shown in FIG. 15, signals C1 and C2 of tap selection signals C1, C2, and C3 change from the High to the LOW level and from the Low to the HIGH level, respectively, and tap D1 is changed over to tap D2, then a hazard will be produced in the output signal.

With regard to the delay line 31 (32) in the input/output-compensated DLLs 3A, and 3B shown in FIGS. 18 and 19, the tap will be changed over during propagation of the signal through the delay line 31 (32) if signal propagation takes, e.g., 2 to 3 ns and the clock cycle is short. Further, with the tCK/2 generating DLL 2B of FIG. 20, tap changeover is performed while the signals CLK1 and CLKHF of the first half of the clock cycle propagate through the delay lines 21 and 22. As a consequence, a hazard is produced in the output signal of the delay line.

Accordingly, it is an object of the present invention to provide a DLL and a semiconductor integrated circuit device of reduced power consumption suited for use in equipment that complies with DDR-II specifications.

Another object of the present invention is to provide a DLL and a semiconductor integrated circuit device in which the occurrence of hazards at the time of tap changeover is suppressed, thereby preventing a deviation in output timing as well as malfunction.

In accordance with one aspect of the present invention, the above and other objects of the invention are attained by providing a delay-locked loop device for adjusting delay times of serially connected first and second delay lines in such a manner that a signal obtained by delaying an input signal by the first and second delay lines is in phase with the input signal, thereby outputting, from the first delay line, a signal that is the result of delaying the input signal by one half cycle of the input signal, comprising:

a frequency dividing circuit for performing frequency division of the input signal, an output signal from said frequency dividing circuit being delayed by said first and second delay lines; and first delay adjustment means for outputting a control signal for adjusting the delay times of said first and second delay lines in such a manner that the output signal of said frequency dividing circuit and an output signal of said second delay line are in phase.

Further, in accordance with the present invention, there is provided a delay-locked loop device comprising, in addition to the above-described elements, a second delay-locked loop for generating a data-output clock signal based upon the input signal and supplying the data-output clock to a multiplexer that selectively outputs multiple items of data, the second delay-locked loop including: a third delay line, to which the output signal of the frequency dividing circuit is input, for outputting a first signal by delaying this output signal; a fourth delay line, to which an output signal of the above-described delay-locked loop device is input, for outputting a second signal by delaying this output signal; a circuit, to which the first and second signals from the third and fourth delay lines, respectively, are input, for outputting, as the data-output clock, a signal in which timings of rising and falling edges of a pulse are decided by rising edges of respective ones of the first and second signals, and in which timings of rising and falling edges of a succeeding pulse are decided by falling edges of respective ones of the first and second signals; and second delay adjusting means for outputting a control signal for adjusting delay times of the third and fourth delay lines in such a manner that a signal obtained by delaying the data-output clock by at least a delay time of the multiplexer will be in phase with the input signal.

Furthermore, the delay-locked loop device according to the present invention may further include a first latch circuit for supplying the control signal from the first delay adjusting means to the first and second delay lines upon latching the control signal by the output signal of the first delay line.

Furthermore, the delay-locked loop device according to the present invention may further include a second latch circuit for supplying the control signal from the second delay adjusting means to the third and fourth delay lines upon latching the control signal by the data-output clock.

In accordance with another aspect of the present invention, the above and other objects of the invention are attained by providing a semiconductor integrated circuit device comprising an input buffer to which a clock signal is input; a frequency dividing circuit, to which the clock signal output from the input buffer is input, for halving frequency of the input clock signal and outputting a frequency-divided clock; a first delay-locked loop circuit that includes a first delay line, to which the frequency-divided clock output from the frequency dividing circuit is input, for outputting a delayed signal from an output tap selected from among a plurality of output taps, a second delay line, to which an output signal of the first delay line is input, for outputting a delayed signal from an output tap selected from among a plurality of output taps, a first phase detector for detecting a phase difference between the frequency-divided clock and an output of the second delay line, and a first counter for counting up or down depending upon an output from the first phase detector and outputting a signal that changes over the output taps of the first and second delay lines; and a second delay-locked loop circuit that includes a third delay line, to which the frequency-divided clock output from the frequency dividing circuit is input, for outputting a delayed signal from an output tap selected from among a plurality of output taps, a fourth delay line, to which an output signal of the first delay line is input, for outputting a delayed signal from an output tap selected from among a plurality of output taps, a first multiplexer, to which output signals of the third and fourth delay lines are input, for outputting a signal in which rising and falling edges of a pulse are decided by timings of rising edges of output signals from respective ones of the third and fourth delay lines, and in which rising and falling edges of a succeeding pulse are decided by timings of falling edges of output signals from respective ones of the third and fourth delay lines, a dummy third multiplexer, receiving and outputting the output signal of the first multiplexer and an having a delay time identical with that of a second multiplexer, said second multiplexer selecting data using the output signal of the first multiplexer as a selection signal, a dummy first buffer to which an output of the third multiplexer is input and having a delay time identical with that of an output buffer, a dummy second buffer to which an output of the first buffer is input and having a delay time identical with that of the input buffer, a second phase detector for detecting a phase difference between the output of the input buffer an output of the dummy second buffer, and a second counter for counting up or down depending upon an output from the second phase detector and outputting a signal that changes over the output taps of the third and fourth delay lines; the output signal of the first multiplexer being input to the second multiplexer, the second multiplexer selecting one of multiple items of data input thereto, and the output buffer, to which an output signal of the second multiplexer is input, outputting this signal from an output terminal.

A semiconductor integrated circuit device in accordance with a further aspect of the present invention, comprises an input buffer to which a clock signal is input; a first delay-locked loop circuit that includes a first delay line, to which the clock signal output from the input buffer is input, for outputting a delayed signal from an output tap selected from among a plurality of output taps, a second delay line, to which an output signal of the first delay line is input, for outputting a delayed signal from an output tap selected from among a plurality of output taps, a first phase detector for detecting a phase difference between the output clock from the input buffer and an output of the second delay line, a first counter for counting up or down depending upon an output from the first phase detector and outputting a signal that changes over the output taps of the first and second delay lines, and a first aligner, to which the output signal of the first delay line is input as a latch signal, for latching the output of the first counter and supplying the output to the first and second delay lines; and a second delay-locked loop circuit that includes a third delay line, to which the clock signal output from the input buffer is output, for outputting a delayed signal from an output tap selected from among a plurality of output taps, a fourth delay line, to which the output signal of the first delay line is input, for outputting a delayed signal from an output tap selected from among a plurality of output taps, a first multiplexer, to which output signals of the third and fourth delay lines are input, for outputting a signal in which rising and falling edges of a pulse are decided by timings of rising edges of output signals from respective ones of the third and fourth delay lines, and in which rising and falling edges of a succeeding pulse are decided by timings of falling edges of output signals from respective ones of the third and fourth delay lines, a second multiplexer, to which the output signal of the first multiplexer is input, for selecting data using the output signal of the first multiplexer as a selection signal, a dummy third multiplexer having a delay time identical with that of the second multiplexer, a dummy first buffer to which an output of the third multiplexer is input and having a delay time identical with that of an output buffer, a dummy second buffer to which an output of the first buffer is input and having a delay time identical with that of the input buffer, a second phase detector for detecting a phase difference between the output of the input buffer an output of the dummy second buffer, a second counter for counting up or down depending upon an output from the second phase detector and outputting a signal that changes over the output taps of the third and fourth delay lines, and a second aligner, to which the output signal of the second multiplexer is input as a latch signal, for latching the output of the second counter and supplying the output to the third and fourth delay lines; the output signal of the first multiplexer being input to the second multiplexer, the second multiplexer selecting one of multiple items of data input thereto, and the output buffer, to which the output signal of the second multiplexer is input, outputting this signal from an output terminal.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 9A is a diagram illustrating the structure of a phase detector used in embodiments of the invention, and FIGS. 9B and 9B are diagrams useful in describing the operation of the phase detector;

PREFERRED EMBODIMENTS OF THE INVENTION

Preferred embodiments for carrying out the present invention will now be described.

Figure 1:
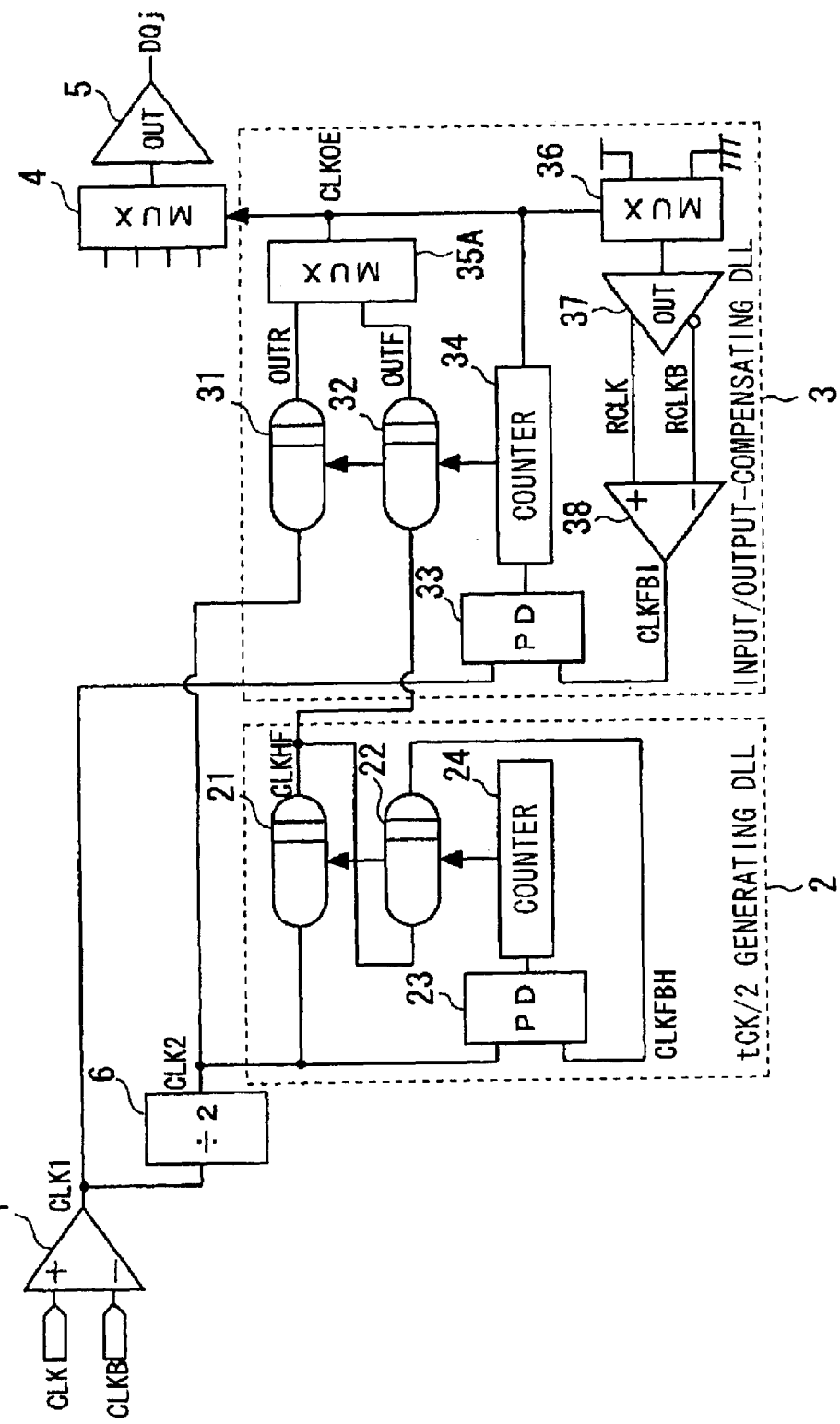
FIG. 1 is a diagram illustrating the structure of a first embodiment of the present invention.

In a first embodiment of the present invention, as shown in FIG. 1, a delay-locked loop (2) for a DCC function is so adapted that the delay times of serially connected first and second delay lines (21, 22) are adjusted in such a manner that a signal obtained by delaying an input signal by the first and second delay lines (21, 22) will be in phase with the input signal, as a result of which the first delay line (21) outputs a signal obtained by delaying the input signal by one half cycle of the input signal. The delay-locked loop (2) is provided with a frequency dividing circuit (6) for performing frequency-division of the input signal, and includes first delay adjusting means (23, 24) for delaying the output signal from the frequency dividing circuit (6) by the first and second delay lines (21, 22) and adjusting the delay times of the first and second delay lines (21, 22) in such a manner that the output signal of the frequency dividing circuit (6) and the output signal of the second delay line (22) will be in phase.

Furthermore, there is provided a second delay-locked loop (3) for generating a data-output clock signal (CLKOE) based upon the input signal and supplying the data-output clock signal (CLKOE) to a multiplexer (4) that selectively outputs multiple items of data. The second delay-locked loop (3) includes a third delay line (31), which receives the output signal of the frequency dividing circuit (6) and outputs a first signal (OUTR) by delaying this output signal; a fourth delay line (32), which receives the output signal of the first delay-locked loop (2), and outputs a second signal (OUTF) by delaying this output signal; a circuit (35A), which receives the first and second signals (OUTR, OUTF)

from the third and fourth delay lines (31, 32), respectively, and outputs, as the data-output clock signal(CLKOE), a signal in which timings of rising and falling edges of a pulse are decided by rising edges of respective ones of the first and second signals, and in which timings of rising and falling edges of the next pulse are decided by falling edges of respective ones of the first and second signals; and second delay adjusting means (33, 34) for adjusting delay times of the third and fourth delay lines in such a manner that a signal obtained by delaying the data-output clock signal(CLKOE) by at least a delay time of the multiplexer (4) will be in phase with the input signal.

More specifically, a semiconductor integrated circuit device according to a preferred embodiment of the present invention has an input buffer (1) to which a clock signal (CLK/CLKB) is supplied; the frequency dividing circuit (6), to which the clock signal output from the input buffer (1) is supplied, for halving frequency of the input clock signal and outputting a frequency-divided clock (CLK2); a DLL (a DLL for generating tCK/2) (2) that includes the delay line (21), to which the frequency-divided clock (CLK2) from the frequency dividing circuit is supplied, for outputting a signal (CLKHF), which is obtained by delaying the frequency-divided clock (CLK2), from an output tap selected from among a plurality of output taps the delay times whereof differ from one another; the delay line (22), to which the output signal (CLKHF) of the delay line (21) is supplied, for outputting a signal (CLKBF), which is obtained by delaying the output signal (CLKHF), from an output tap selected from among a plurality of output taps the delay times whereof differ from one another; a phase detector (23) for detecting a phase difference between the frequency-divided clock signal(CLK2) and the output clock signal (CLKFBH) of the delay line (22); and a counter (24), which receives the output of the phase detector (23), for counting up or down in accordance with the lead/lag phase relationship and outputting a signal that changes over the output taps of the delay lines (21, 22).

A semiconductor integrated circuit device according to a preferred mode for carrying out the present invention further has a DLL (an input/output-compensated DLL) (3) that includes the delay line (31), which receives the frequency-divided clock output (CLK2) from the frequency dividing circuit (6), for outputting a signal (OUTR), which is obtained by delaying the frequency-divided clock (CLK2), from an output tap selected from among a plurality of output taps the delay times whereof differ from one another; the delay line (32), which receives the output signal (CLKHF) of the delay line (31), for outputting a signal (OUTF), which is obtained by delaying the signal (CLKHF), from an output tap selected from among a plurality of output taps the delay times whereof differ from one another; a multiplexer (35A), which receives the output signals (OUTR, OUTF) from the delay lines (31, 32), respectively, for outputting a signal in which timings of rising and falling edges of a pulse are decided by rising edges of respective ones of the output signals (OUTR, OUTF), and for outputting a signal in which timings of rising and falling edges of the next pulse are decided by falling edges of respective ones of the output signals (OUTR, OUTF); a dummy multiplexer (36) which receives the output signal (CLKOE) of the multiplexer (35A) and having a delay time identical with that of the multiplexer (4); a dummy first buffer (37) which receives the output signal of the dummy multiplexer (36) and has a delay time identical with that of an output buffer (5); a dummy second buffer (38) which receives the output signals of the first buffer (37) are input and has a delay time identical with that of the input buffer (1); a phase detector (33), which receives the output signal (CLK1) of the input buffer (1) and the output signal (CLKFBI) of the dummy second buffer (38), for detecting the phase difference between these signals; and a counter (34), which receives the output of the phase detector (33), for counting up or down in accordance with the lead/lag phase relationship and outputting a signal that changes over the output taps of the delay lines (31, 32).

The output signal (CLKOE) of the multiplexer (35A) is fed to the multiplexer (4) as the data-output clock, and the multiplexer (4) selects one item of multiple (e.g., four) items of data. The output buffer 5, which receives the output signal of the multiplexer (4), delivers this signal from the output terminal.

The multiplexer (35A) includes a first signal generating circuit (301, 302 and 303 in FIG. 12), which receives the output signal (OUTR) of the delay line (31), for detecting the positive- and negative-going transitions of the output signal (OUTR) and for generating a pulse having a predetermined pulse width; a second signal generating circuit (309, 310 and 311 in FIG. 12), which receives the output signal (OUTF) of the delay line (32) is input, for detecting the positive- and negative-going transitions of the output signal (OUTF) and for generating a pulse having a predetermined pulse width; and first and second transistors (MP21, MP22) of mutually opposite conductivity types connected serially between a high-potential power supply VDD and a low-potential power supply GND for producing an output signal from the connection between them. A signal obtained by inverting the output of the first signal generating circuit is supplied to the control terminal of the first transistor (MP21), and a signal obtained by delaying the output of the second signal generating circuit is supplied to the control terminal of the second transistor (MN22).

Figure 6:
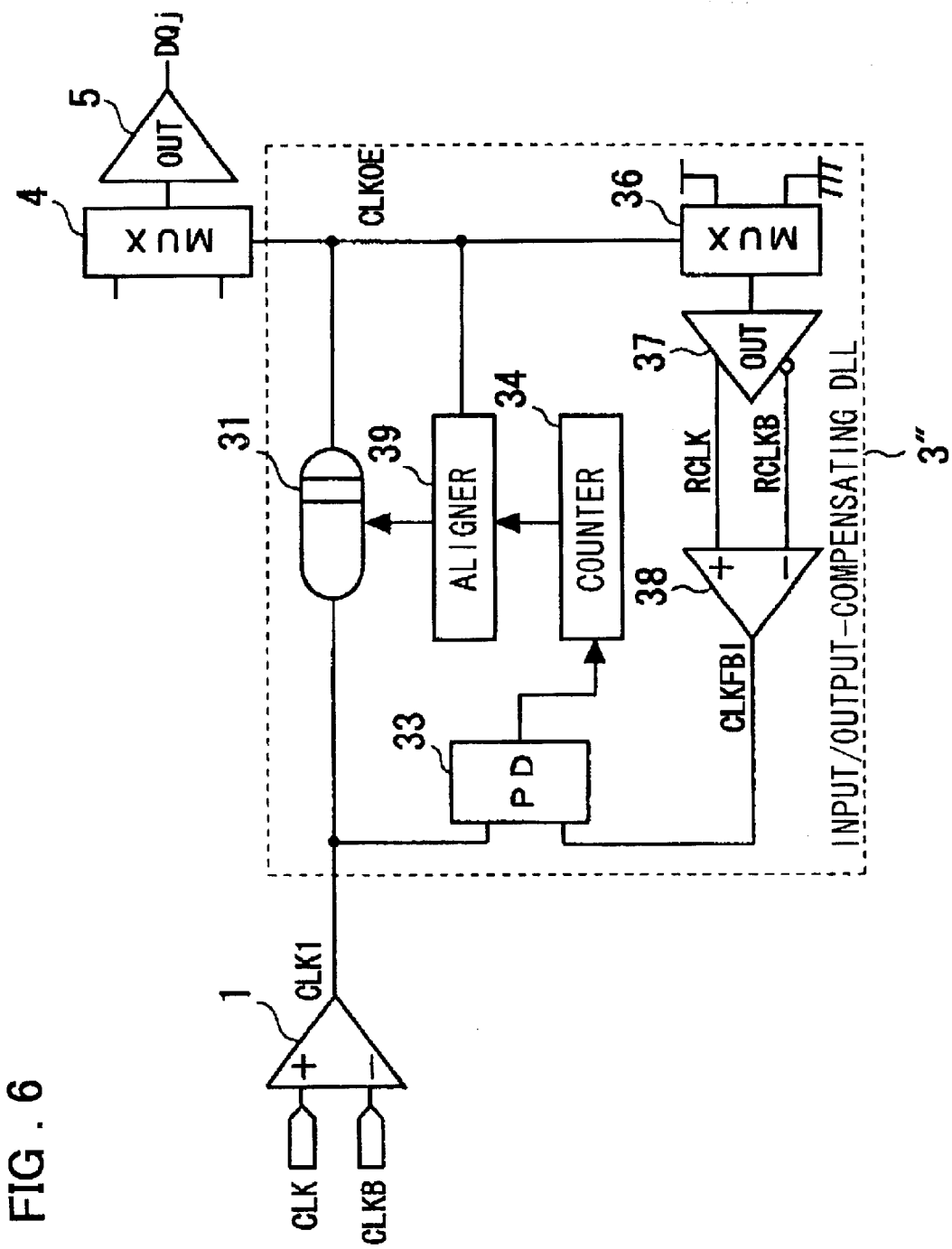
FIG. 6 is a diagram illustrating the structure of a fourth embodiment of the present invention.
Figure 18:
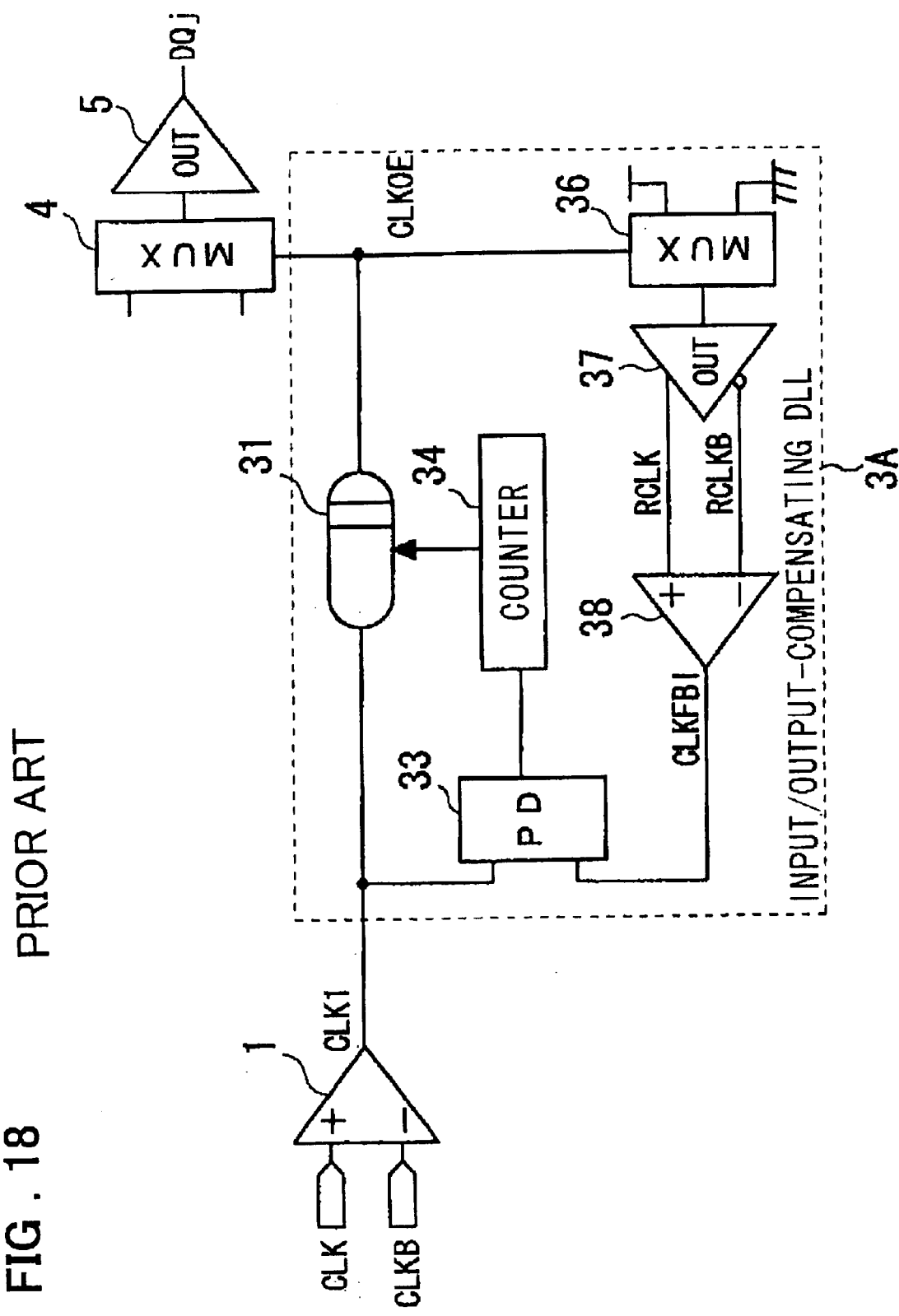
FIG. 18 is a diagram illustrating the structure of a DLL circuit according to the prior art.
Figure 19:
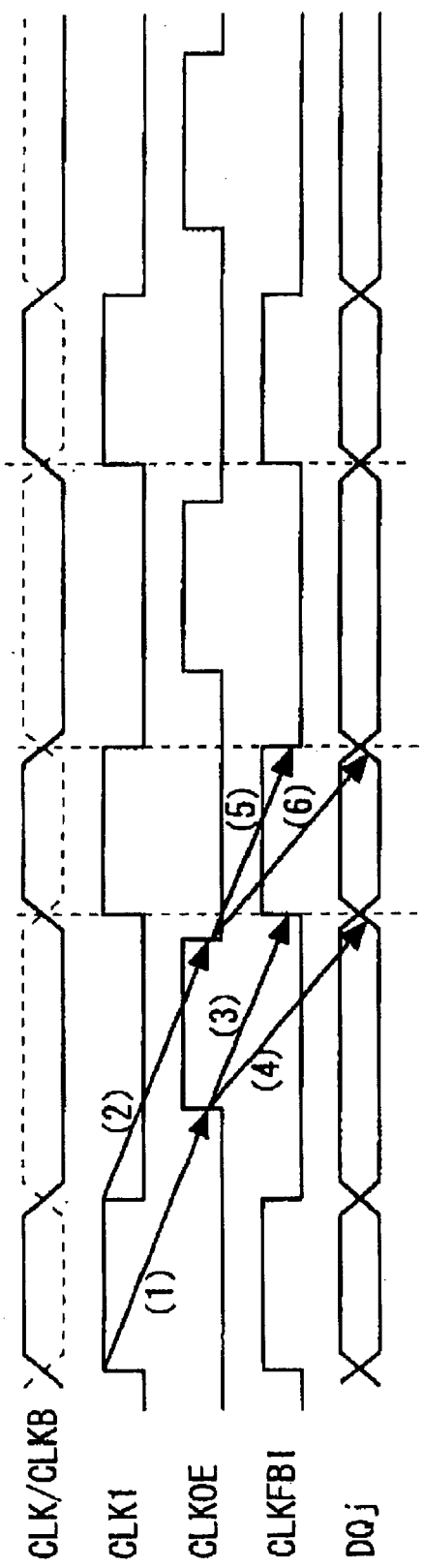
FIG. 19 is a diagram useful in describing the timing operation of the circuit shown in FIG. 18.

As shown in FIG. 6, which illustrates another embodiment of the present invention, the DLL depicted in FIG. 18 is further provided with an aligner (39), which receives the output signal (CLKOE) of the delay line (31) as a latch timing signal, for latching the tap selection signal output from the counter (34) and for supplying this signal to the delay line (31).

Figure 5:
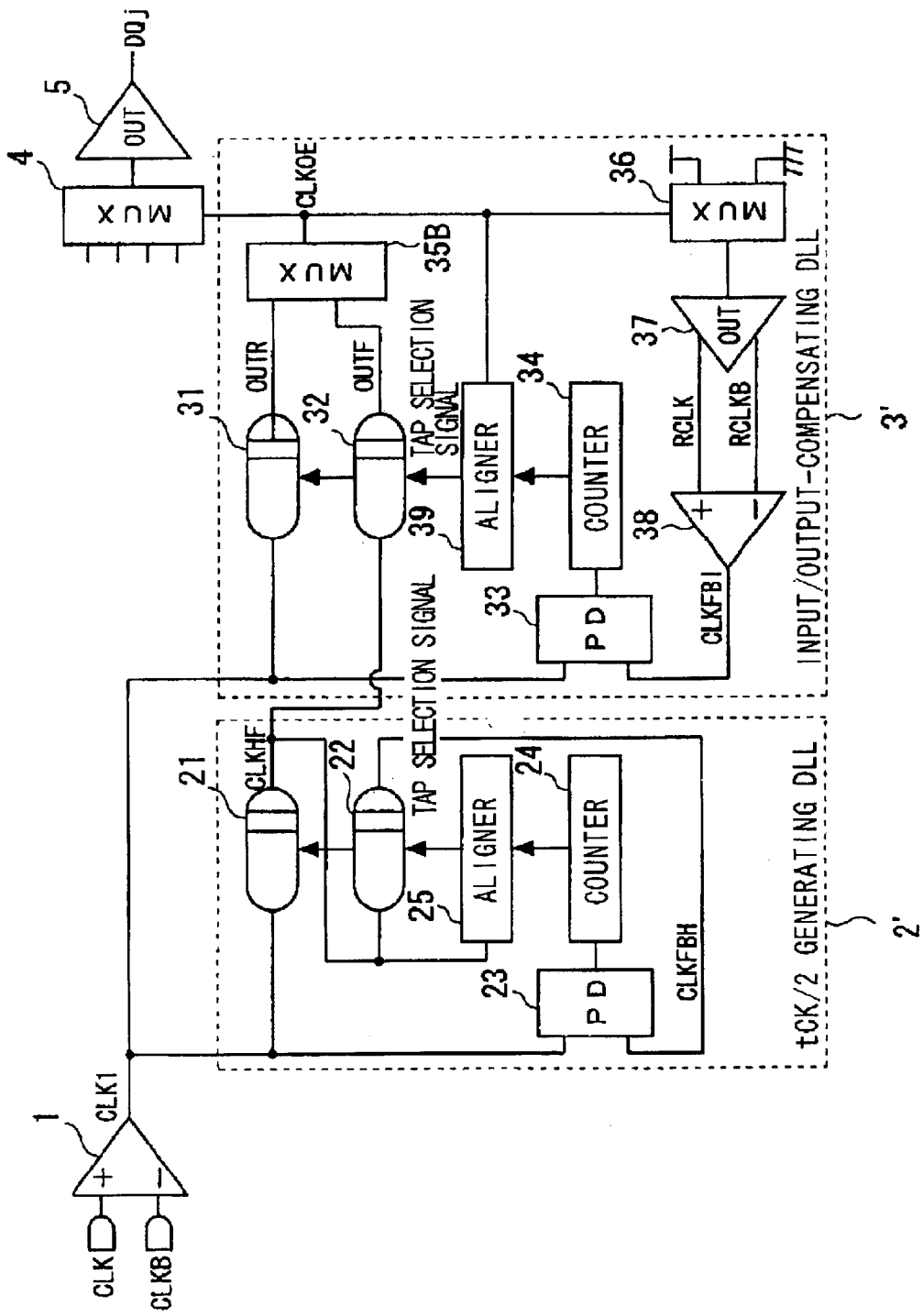
FIG. 5 is a diagram illustrating the structure of a third embodiment of the present invention.

Further, as shown in FIG. 5, which illustrates another embodiment of the present invention, there are further provided an aligner (25), which receives the output signal (CLKHF) of the delay line (21) as a latch timing signal, for latching the tap selection signal output from the counter (24) and for supplying this signal to the delay lines (21, 22), and an aligner (39), which receives the signal (CLKOE) output from the multiplexer (35B) is input as a latch timing signal, for latching the tap selection signal output from the counter (34) and for supplying this signal to the delay lines (31, 32).

Figure 3:
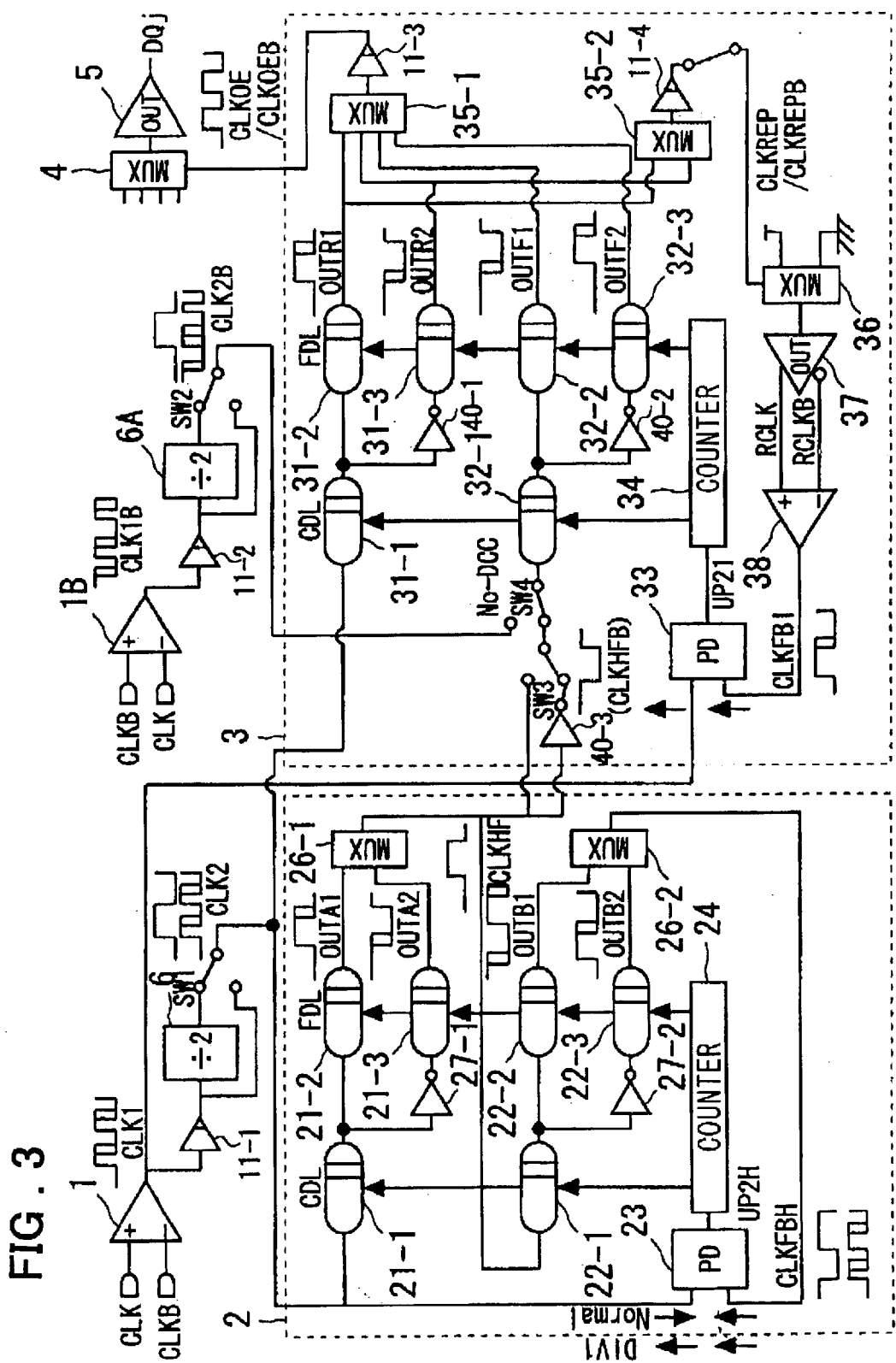
FIG. 3 is a diagram illustrating the structure of a second embodiment of the present invention.

In the embodiment for practicing the present invention, as shown in FIG. 3, the delay line (31) of the input/output-compensating DLL (3) may be comprised of a coarse delay line (31-1), a fine delay line (31-2) which receives the output of the coarse delay line (31-1), and a fine delay line (31-3), which receives a signal obtained by inverting the output signal of the coarse delay line (31-1) by an inverter, and the delay line (32) of the input/output-compensating DLL (3) may be comprised of a coarse delay line (32-1), a fine delay line (32-2) which receives the output of the fine delay line (32-1) is input, and a fine delay line (32-3) which receives a signal obtained by inverting the output signal of the coarse delay line (32-1) by an inverter. In this case, first to fourth signal (OUTR1, OUTR2, OUTF1, and OUTF2) from respective ones of the fine delay lines are supplied to a multiplexer (35-1). The multiplexer (35-1) outputs a clock signal the timings of the rising and falling edges of which are decided by the rising edges of the first and fourth signals (OUTR1, OUTF2), and a clock signal the timings of the rising and falling edges of which are decided by the falling edges of the second and third signals (OUTR2, OUTF1).

The delay line (21) of the DLL (2) for generating tCK/2 may be comprised of a coarse delay line (21-1), a fine delay line (21-2) which receives the output of the coarse delay line (21-1), a fine delay line (21-3) which receives a signal obtained by inverting the output signal of the coarse delay line (21-1) by an inverter, and a multiplexer (26-1), which receives the output signals of the fine delay lines (21-2, 21-3), for synthesizing a single-end signal and outputting the same. The delay line (22) of the DLL (2) for generating tCK/2 includes a coarse delay line (22-1), a fine delay line (22-2) which receives the output of the fine delay line (22-1), a fine delay line (22-3) which receives a signal obtained by inverting the output signal of the coarse delay line (22-1) by an inverter; and a multiplexer (26-2), which receives the output signals of the fine delay lines (22-2, 22-3), for synthesizing a single-end signal and outputting the same.

In this embodiment of the present invention, as shown in FIG. 3, a first changeover switch (SW1) may be provided for selecting either the clock signal from the input buffer (1) or the frequency-divided clock from the frequency dividing circuit (6) and supplying the selected signal to the first delay line (21) and first phase detector (23). There may also be provided a second input buffer (1B) for generating a clock signal (CLK 1B) that is a complementary signal of the clock signal (CLK1) output from the input buffer (1), a second frequency dividing circuit (6A) for performing frequency division of the clock signal from the second input buffer, and a second changeover switch (SW2) for selecting either the clock signal from the second input buffer or the frequency-divided clock from the second frequency dividing circuit and supplying the selected signal to the fourth delay line.

Embodiments of the present invention will now be described in greater detail with reference to the drawings.

FIG. 1 is a diagram illustrating the structure of an embodiment of the present invention.

Figure 20:
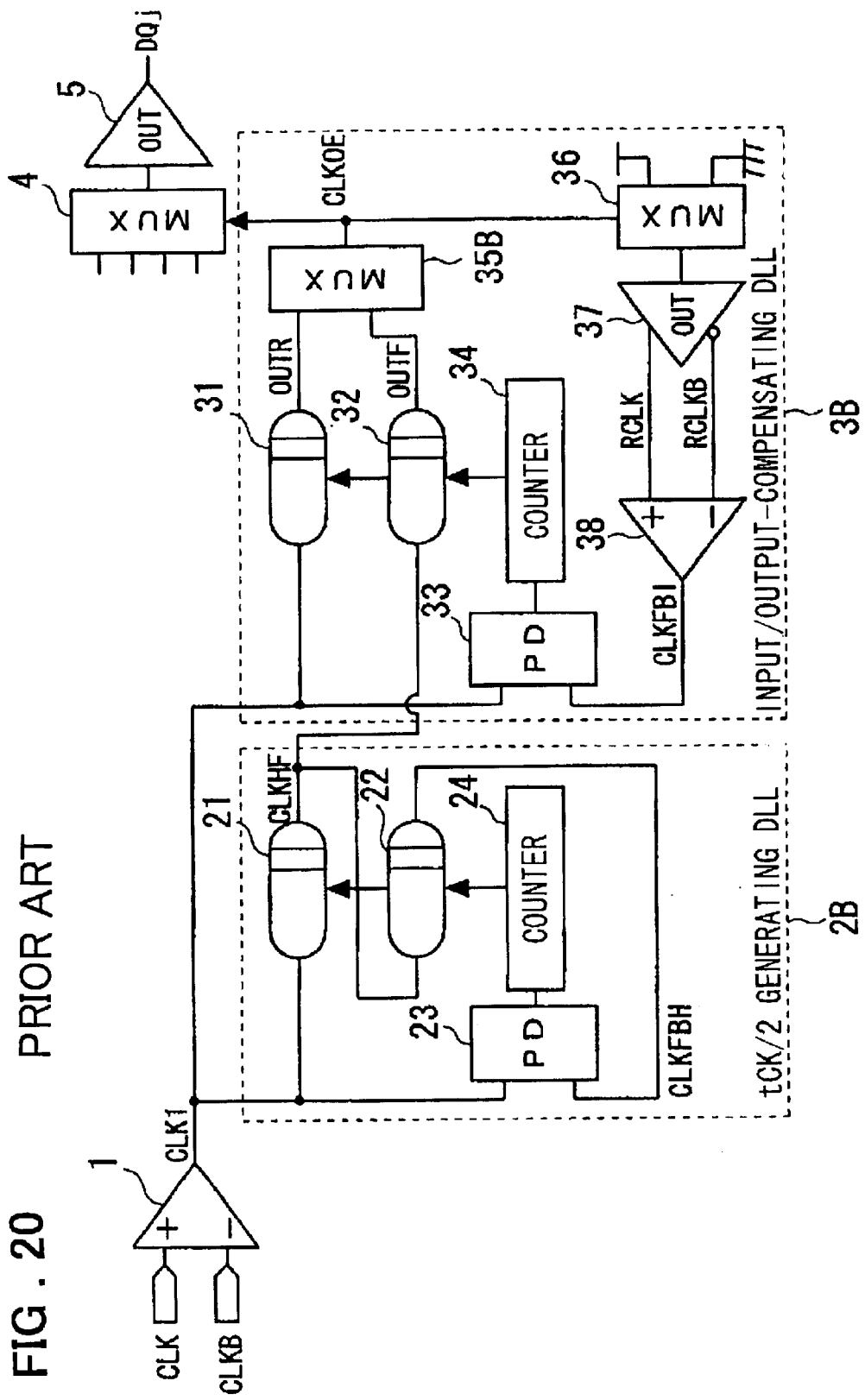
FIG. 20 is a diagram illustrating the structure of a DLL circuit according to the prior art.
Figure 21:
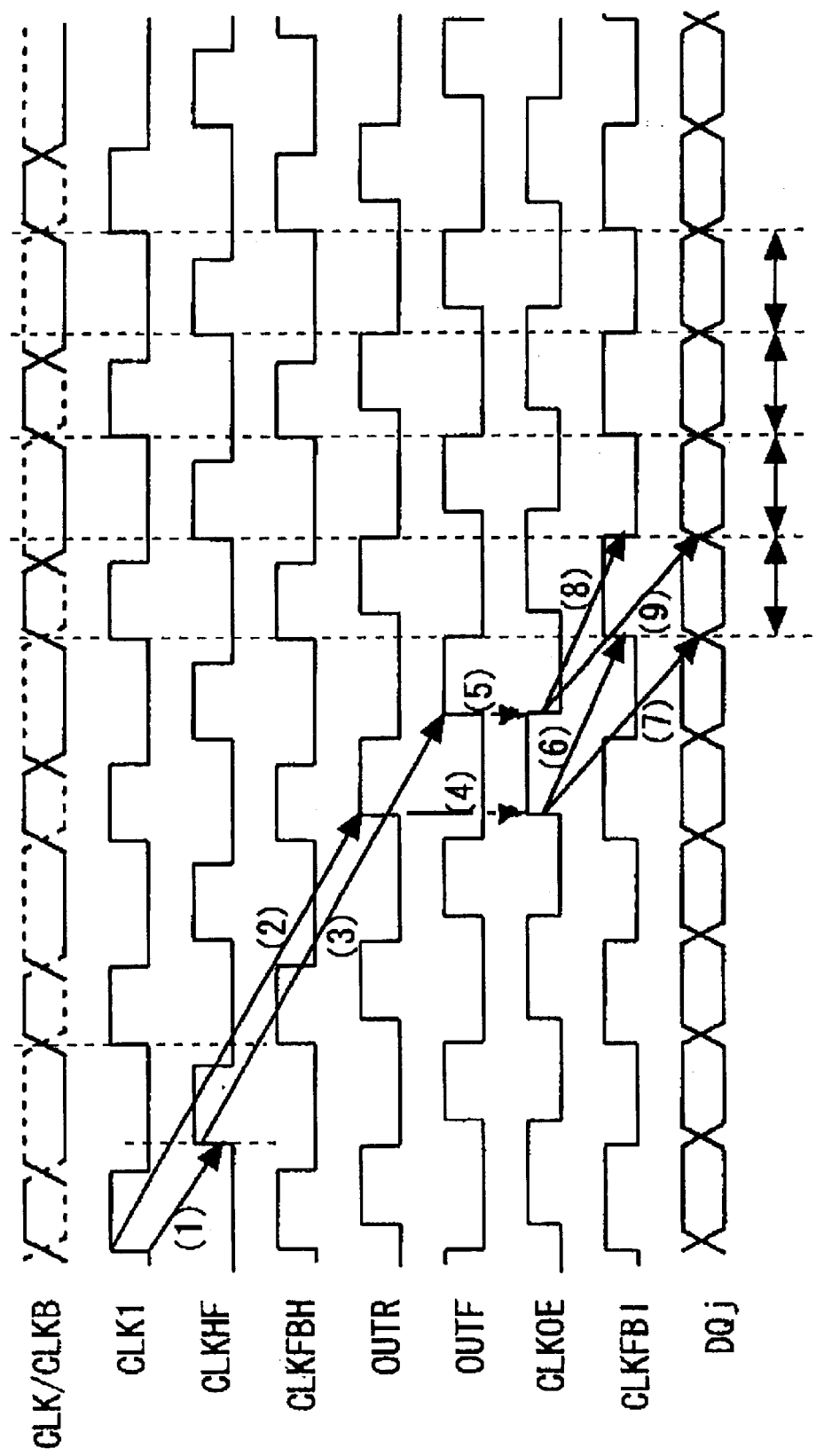
FIG. 21 is a diagram useful in describing the timing operation of the circuit shown in FIG. 20.

As shown in FIG. 1, this embodiment is obtained by providing the conventional circuit arrangement of FIG. 20 with a frequency dividing circuit 6, which halves the frequency of the output clock signal CLK1 from an input buffer 1 and outputs a frequency-divided clock signal CLK2. The clock CLK2 (the period of which is equal to 2×tCK), the frequency of which has been halved by the frequency dividing circuit 6, is supplied to delay line 21 and phase detector 23 of a tCK/2 generating DLL 2 and to delay line 23 and phase detector 33 of an input/output-compensating DLL 3. A multiplexer 35A operates at both the rising and falling edges of the output signals OUTR and OUTF of delay lines 31 and 32, thereby outputting the signal CLKOE (a clock signal for data output). The signal CLKOE output from the multiplexer 35A comprises a pulse the timings of the rising and falling edges of which are decided by the rising edges of respective ones of the signals OUTR and OUTF, and a succeeding pulse the timings of the rising and falling edges of which are decided by the falling edges of respective ones of the signals OUTR and OUTF. In contrast, the multiplexer 35B shown in FIG. 20 operates at the rising edges of the output signals OUTR and OUTF of delay lines 31 and 32.

More specifically, as shown in FIG. 1, the arrangement includes the input buffer 1 connected to an input terminal (not shown) and having the clock signal CLK input thereto; the frequency dividing circuit 6, which receives the clock signal that is output from the input buffer 1, and outputs the frequency-divided clock CLK2 obtained by halving the frequency of the clock signal CLK; the tCK/2 generating DLL 2; the input/output-compensating DLL 3; a multiplexer 4; and an output buffer 5 whose output terminal is connected to a data output terminal (not shown).

The tCK/2 generating DLL 2 includes the delay line 21, which receives the frequency-divided clock CLK output from the frequency dividing circuit 6, and outputs the signal CLKHF, which is obtained by delaying the frequency-divided clock CLK2, from an output tap selected from among a plurality of output taps; the delay line 22, which receives the output signal CLKHF of the delay line 21, and outputs the signal CLKFBH, which is obtained by delaying the signal CLKHF, from an output tap selected from among a plurality of output taps; the phase detector 23 for detecting the phase difference between the frequency-divided clock CLK2 and the output signal CLKFBH of the delay line 22; and a counter 24 for counting up or down depending upon the output of the phase detector 23 and outputting a tap selection signal that changes over the output taps of the delay lines 21 and 22. In a case where it is necessary to lengthen the delay of the delay lines 21 and 22, the counter 24 counts up, for example, to output a tap selection signal for selecting an output tap having a longer delay time. In a case where it is necessary to shorten the delay of the delay lines 21 and 22, the counter 24 counts down, for example, to output a tap selection signal for selecting an output tap having a shorter delay time.

The input/output-compensating DLL 3 includes the delay line 31, which receives the frequency-divided clock CLK2 output from the frequency dividing circuit 6, for outputting the signal OUTR (the period of which is equal to 2×tCK, where tCK represents one cycle of the clock CLK), which is obtained by delaying the frequency-divided clock CLK2, from an output tap selected from among the plurality of output taps; the delay line 32, to which the output signal CLKHF of the delay line 21 is input, for outputting the signal OUTF (the period of which is equal to 2×tCK), which is obtained by delaying the signal CLKHF, from an output tap selected from among the plurality of output taps; a multiplexer 35A, which receives the output signals OUTR and OUTF from the delay lines 31 and 32, respectively, as inputs, and outputs the signal CLKOE (the clock for data output), which rises at the timing of the rising edge of signal OUTR and falls at the timing of the rising edge of signal OUTF, and which then rises at the timing of the falling edge of signal OUTR and falls at the timing of the falling edge of signal OUTF; a dummy multiplexer 36 which receives the output signal CLKOE of the multiplexer 35A and has a delay time identical with that of the multiplexer 4; a dummy first buffer 37 which receives the output signal of the dummy multiplexer 36 and has a delay time identical with that of an output buffer 5; a dummy second buffer 38, which receives the complementary outputs RCLK and RCLKB of the buffer 37 as inputs, and outputs a single-ended signal CLKFBI, a buffer 38 having a delay time identical with that of the input buffer 1; the phase detector 33 for detecting the phase difference between the output clock CLK1 of input buffer 1 and the output signal CLKFBI of the dummy buffer 38; and a counter 34 for counting up or down depending upon the output of the phase detector 33 and outputting the tap selection signal for changing over the taps of the delay lines 31 and 32. In a case where it is necessary to lengthen the delay of the delay lines 31 and 32, the counter 34 counts up, for example, to output a tap selection signal for selecting an output tap having a longer delay time. In a case where it is necessary to shorten the delay of the delay lines 31 and 32, the counter 34 counts down, for example, to output a tap selection signal for selecting an output tap having a shorter delay time.

The multiplexer 4, which receives the output signal CLKOE of multiplexer 35, selects one of four items of data successively edge by edge of the signal CLKOE, and the output buffer 5 delivers the output signal DQj of multiplexer 4 from the output terminal. The dummy multiplexer 36, which has a delay time identical with that of the multiplexer 4, has High- and LOW level fixed values input thereto and selectively outputs these valued at the positive- and negative-going transitions of the signal CLKOE.

Figure 2:
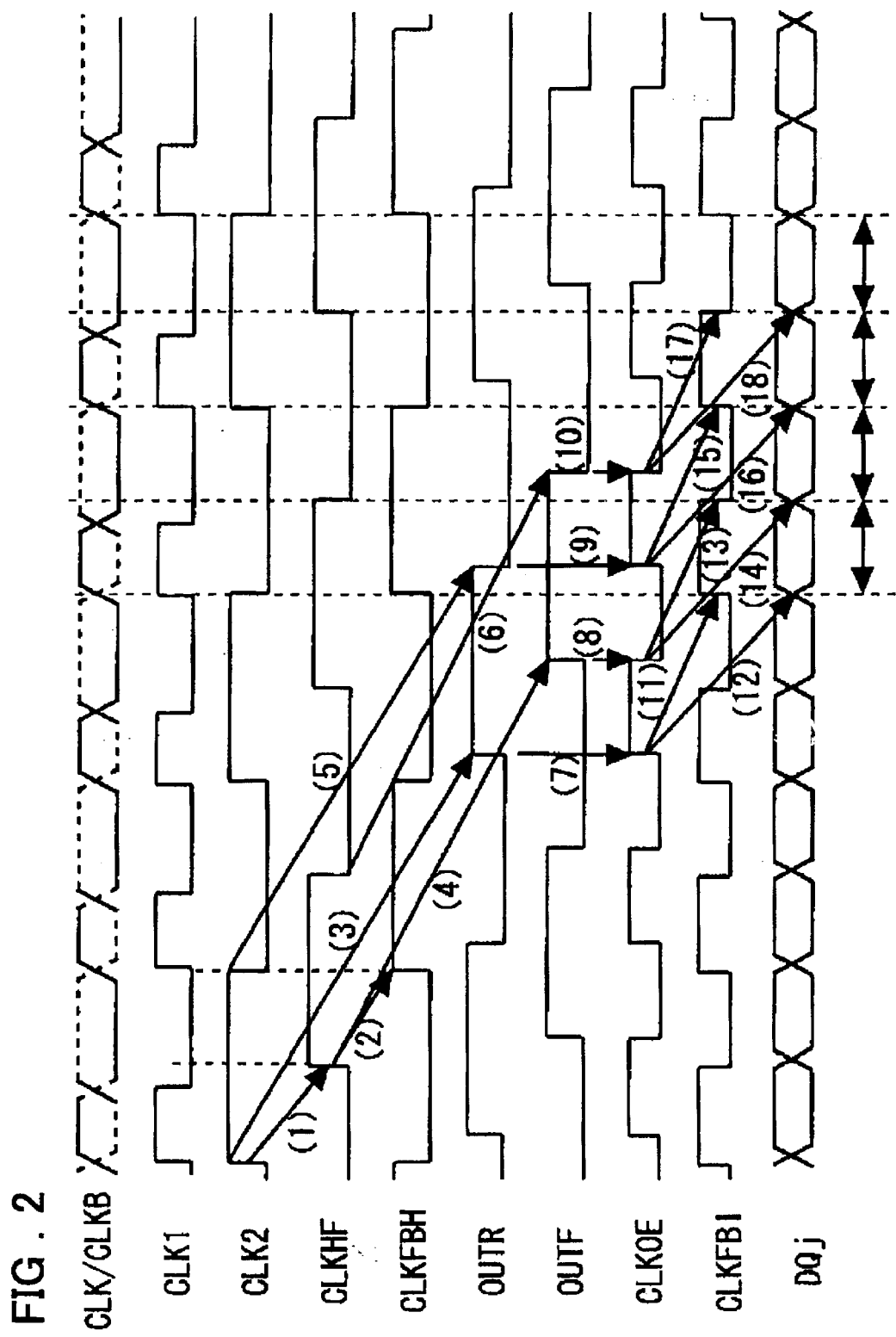
FIG. 2 is a diagram useful in describing the timing operation of the first embodiment.

FIG. 2 is a timing chart useful in describing the operation of the circuit shown in FIG. 1. The operation of this circuit will now be described with reference to FIG. 2.

The delay lines 21 and 22 in the tCK/2 generating DLL 2 delay the frequency-divided clock CLK2 (the period of which is twice that of the clock CLK) and are adjusted in such a manner that the edges of the output signal CLKFBH of delay line 22 will coincide with the edges of the frequency-divided clock CLK2.

If we let td represent the delay time of each of the delay lines 21 and 22, then the following will hold:

$$2td = tCK$$

and the signal CLKHF is a signal of period 2×tCK delayed by tCK/2 relative to the frequency-divided clock CLK2.

The output signal OUTR, which is the result of delaying the frequency-divided clock CLK2 by dt0 in the delay line 31, and the output signal OUTF, which is the result of delaying the signal CLKHF (whose period is 2tCK) output from the delay line 21 by td0 in the delay line 32, are input to the multiplexer 35A, whereby the multiplexer 35A outputs the signal CLKOE (the data-output clock), which rises at the timing of the rising edge of signal OUTR and falls at the timing of the rising edge of signal OUTF, and which then rises at the timing of the falling edge of signal OUTR and falls at the timing of the falling edge of signal OUTF.

The cycle of the signal CLKOE is tCK. It should be noted that the time over which the signal OUTR (whose cycle is 2×tCK) is at HIGH level and the timing of the rising edge of the signal OUTF (whose cycle is 2×tCK) delayed by tCK/2 relative to the signal OUTR overlap, that the time over which the signal OUTF is at the HIGH level and the timing of the falling edge of the signal OUTR overlap, and that signal CLKOE produced is such that the signal rises at the timing of the rising edge of signal OUTR, falls at the timing of the rising edge of signal OUTF, then rises at the timing of the falling edge of the HIGH level signal OUTR and falls at the timing of the falling edge of the HIGH level signal OUTF.

The clock signal CLKOE propagates through the dummy multiplexer 36, whose delay time is identical with that of the multiplexer 4, the buffer 37, whose delay time is identical with that of the output buffer 5, and the buffer 38, whose delay time is identical with that of the input buffer 1, and enters the phase detector 33 as the signal CLKFBI. The phase detector 33 detects the phase difference between the clock CLK1 and the signal CLKFBI and, based upon the output of the phase detector 33, the counter 34 counts up or down. The taps of the delay lines 31 and 32 are changed over based upon the output of the counter 34.

The multiplexer 4 changes over the output data at the timings of the rising and falling edges of the signal CLKOE, which constitutes the data-output clock.

The signal CLKHF rises [see arrow (1) in FIG. 2] upon being delayed by tCK/2 in delay line 21 relative to the rising edge of the frequency-divided clock CLK2, and the signal CLKFBH rises [see arrow (2) in FIG. 2] upon being delayed by tCK/2 in delay line 21 relative to the rising edge of signal CLKHF.

The signal OUTR rises [see arrow (3) in FIG. 2] upon being delayed by the delay time of delay line 21 relative to the rising edge of the frequency-divided clock CLK2, and falls [see arrow (5) in FIG. 2] upon being delayed by the delay time of delay line 31 relative to the falling edge of the frequency-divided clock CLK2.

The signal OUTF rises [see arrow (4) in FIG. 2] upon being delayed by the delay time of delay line 32 relative to the rising edge of the signal CLKHF, and falls [see arrow (6) in FIG. 2] upon being delayed by the delay time of delay line 32 relative to the falling edge of the signal CLKHF.

The data-output clock signal CLKOE rises [see arrow (7) in FIG. 2] at the timing of the rising edge of signal OUTR and falls [see arrow (8) in FIG. 2] at the timing of the rising edge of the signal OUTF, which has been delayed by tCK/2.

Next, the data-output clock signal CLKOE rises [see arrow (9) in FIG. 2] at the falling edge of signal OUTR and falls [see arrow (10) in FIG. 2] at the falling edge of the signal OUTF, which has been delayed by tCK/2.

Accordingly, the pulse width of the data-output clock CLKOE is $$td0 + tCK/2 - td0 = tCK/2$$

The rising edge of the signal CLKFBI is delayed relative to the rising edge of the signal CLKOE by time td1+td2+td3, which is the sum of delay times td3, td2, and td1 of dummy multiplexer 36 and buffers 37, and 38, respectively [arrow (11) in FIG. 2].

Control is exercised in such a manner that the rising edge of signal CLKFBI will coincide with the rising edge of clock CLK1 prevailing n cycles after the clock CLK from which the present signal CLKFBI originates (where CLK1 is delayed by the delay time td1 of input buffer 1 relative to the starting timing of the cycle of clock CLK). Consequently, the timing of the rising edge of signal CLKFBI becomes $$ntCK + td1$$

with the timing of the rising edge of the original input clock CLK serving as the reference.

Accordingly, the timing of the rising edge of clock CLKOE becomes $$ntCK + td1 - (td1 + td2 + td3) = ntCK - td2 - td3$$

In the data output propagation path through the multiplexer 4, the delay time of the output of multiplexer 4 relative to the rising edge of signal CLKOE is td3 and the delay time of the output buffer 5 is td2 [arrow (12) in FIG. 2]. The output timing of the data output signal DQj, therefore, is $$(ntCK - td2 - td3) + td3 + td2 = ntCK$$

In other words, the starting point of the clock cycle of clock CLK (the timing of the rising edge of clock CLK) and the timing at which the data output signal DQj is delivered agree.

Further, the timing of the falling edge of signal CLKOE lags behind the timing of the rising edge thereof by tCK/2, and the output timing of the second data output signal DQj, which is the next signal, is tCK/2 after the starting point of the clock cycle of clock CLK [arrow (14) in FIG. 2].

Furthermore, in the data output propagation path through the multiplexer 4, the delay time of the output of multiplexer 4 relative to the rising edge of the next clock CLKOE (this rising edge lags behind the immediately preceding rising edge of this signal by tCK) is td3 and the delay time of the output buffer 5 is td2. The output timing of the third data output signal DQj, therefore, is (ntCK−td2−td3)+td3+td2+tCK=ntCK+tCK This becomes the timing of the starting point of the next clock cycle of clock CLK [arrow (16) in FIG. 2].

Further, the timing of the falling edge of the clock CLKOE lags behind its rising edge by tCK/2, and the output timing of the fourth data output signal DQj is tCK/2 after the starting point of the next clock cycle of clock CLK [arrow (18) in FIG. 2]. Thus, operation takes place as shown in FIG. 2.

As illustrated in FIG. 2, four data output signals are produced, based upon signal CLKOE, in two clock cycles of the clock signal CLK, and the durations of the data outputs are equal, namely tCK/2.

A second embodiment of the present invention will now be described with reference to FIG. 3, which illustrates the structure of the second embodiment.

According to this embodiment, as shown in FIG. 3, the clock obtained by halving the frequency of the input clock signal CLK1 by the frequency dividing circuit 6 or the clock signal CLK1 (undivided) can be employed in the tCK/2 generating DLL 2 by switching between these clocks using a switch SW1. Similarly, the clock signal obtained by halving the frequency of an input clock CLK1B (the complementary signal of the clock CLK1) by a frequency dividing circuit 6A or the clock signal CLK1B (undivided) can be employed in the input/output-compensated DLL 3 by switching between these clocks using a switch SW2. Further, a switch SW4 makes it possible to select a connection in such a manner that the duty correction (DCC) function is not introduced. Aspects of the second embodiment that differ from those of first embodiment shown in FIG. 1 will be described below.

The delay line 21 in FIG. 1, in the DLL 2 for generating tCK/2, in this embodiment, is comprised of a coarse delay line (CDL) 21-1, a fine delay line (FDL) 21-2 which receives the output signal of the coarse delay line (CDL) 21-1, and a fine delay line 21-3 which receives a signal obtained by inverting the output signal of the coarse delay line (CDL) 21-1 by an inverter 27. Outputs OUTA1 and OUTA2 of the fine delay lines 21-2, and 21-3, respectively, are fed to a multiplexer 26-1, which outputs the single-phase (single-end) signal CLKHF. The delay line 22 in FIG. 1, also is comprised of a coarse delay line (CDL) 22-1 and fine delay lines 22-2, and 22-3 which receive respectively an un-inverted output of the coarse delay line (CDL) 22-1 and an output of an inverter 27-2 which receives the output of the coarse delay line (CDL) 22-1 as an input signal, and outputs inverted signal of the input signal. Outputs OUTB1 and OUTB2 of the fine delay lines 22-2, and 22-3, respectively, are supplied to a multiplexer 26-2, which outputs the single-phase (single-ended) signal CLKFBH. This signal is supplied to the phase detector 23.

The counter 24, which receives the output of the phase detector 23, outputs a signal that changes over the taps of the coarse delay lines 21-1, 22-1 and fine delay lines 21-2, 21-3, 22-2, and 22-3.

The delay line 31 in the input/output-compensated DLL 3 also includes a coarse delay line (CDL) 31-1 and fine delay lines 31-2 and 31-3 which receive respectively an un-inverted output of the coarse delay line (CDL) 31-1 and an output of an inverter 40-1 which receives the output of the coarse delay line (CDL) 31-1 as an input signal, and outputs inverted signal of the input signal. Outputs OUTR1, and OUTR2 of the fine delay lines 31-2 and 31-3, respectively, are supplied to a multiplexer 35-2, which outputs a single-end signal CLKREP. The delay line 32 in FIG. 1 also is comprised of a coarse delay line (CDL) 32-1 and fine delay lines 32-2 and 32-3 which receive respectively an un-inverted output of the coarse delay line (CDL) 32-1 and an output of an inverter 40-2 which receives the output of the coarse delay line (CDL) 32-1 as an input signal, and outputs inverted signal of the input signal. Outputs OUTF1, and OUTF2 of the fine delay lines 32-2 and 32-3, respectively, are input to a multiplexer 35-1 together with the outputs OUTR1, and OUTR2 of the fine delay lines 31-2 and 31-3. The multiplexer 35-1 outputs the data-output clock CLKOE and supplies it to the multiplexer 4. The latter selectively outputs data based upon the data-output clock CLKOE, and the selected data is output from the output buffer 5 as data DQj.

The multiplexer 35-2, which receives the signal OUTR1 and OUTR2, outputs the single-ended signal CLKREP the timings of the rising and falling edged whereof are decided by the rising edges of respective ones of the signals OUTR1 and OUTR2. The signal CLKREP is supplied to the dummy multiplexer 36, the delay time of which is identical with that of the multiplexer 4, the output of the dummy multiplexer 36 enters the dummy buffer 37, whose delay time is identical with that of the output buffer 5, and the buffer 37 outputs complementary clocks RCLK and RCLKB. These clocks enter the dummy buffer 38 whose delay time is identical with that of the input buffer 1. The buffer 38 output the single-end signal CLKFBI, which enters the phase detector 33.

The counter 34, which receives the output of the phase detector 33, outputs a signal that changes over the taps of the coarse delay lines 31-1, and 32-1 and fine delay lines 31-2, 31-3, 32-2, and 32-3.

If the DCC function is not used in the arrangement depicted in FIG. 3, the switch SW4 selects the output of switch SW2 as the input to the delay line 32-1 and is not connected to the signal CLKHF output from the tCK/2 generating DLL 2. The frequency-divided output of the frequency dividing circuit 6A or the input clock CLKB1B is selected in the input/output-compensated DLL 3 by the switch SW2.

It should be noted that the inputs to the input buffer 1B are opposite in phase to those at the same input terminals of the input buffer 1, and that the output of the input buffer 1B is opposite in phase to the output clock CLK1 of input buffer 1. In a case where the DCC function is to be used, the uninverted or inverted signal of the signal CLKHF output from the tCK/2 generating DLL 2, is selected by switch SW3 and is supplied to the delay line 32-1 by switch SW4.

Figure 4:
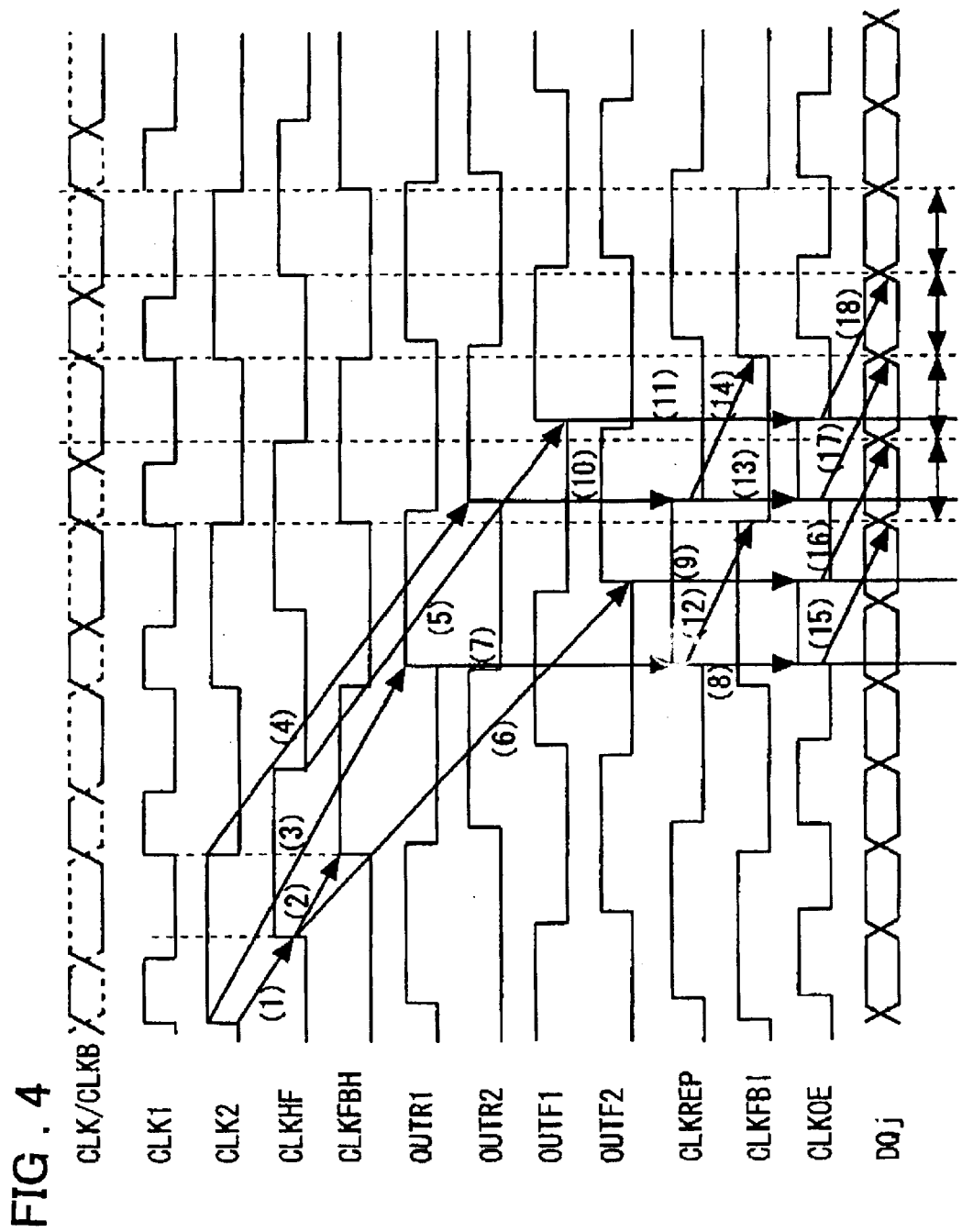
FIG. 4 is a diagram useful in describing the timing operation of the second embodiment.

In a case where the clock CLK2 whose frequency has been halved is selected at switch SW1 as the clock supplied to the tCK/2 generating DLL 2, the clock CLK2B whose frequency has been halved is selected at the switch SW2 in the input/output-compensating DLL 3 as well. In this case, the timing operation is as illustrated in FIG. 4. In this embodiment, the signals OUTR1, OUTR2, OUTF1, and OUTF2 are output, as illustrated in FIG. 4, and the signal CLKOE is created using the rising edges of the signals OUTR1, OUTR2, OUTF1, and OUTF2 instead of both edges of the signals OUTR and OUTF, as depicted in FIG. 2 [see (7), (9) and (10), (11) in FIG. 4].

Operation in a case where the normal clock has been selected in the tCK/2 generating DLL 2 and also in the input/output-compensated DLL 3 is similar to that illustrated in FIG. 20.

In a case where "No DCC" is selected (i.e., the DCC function is not selected) at switch SW4, only the input/output-compensating DLL 3 operates. The input/output-compensating DLL 3 employs the coarse delay line 31-1 and the fine delay lines 31-2 and 31-3 with regard to the clock CLK1 from the input buffer 1, and employs the coarse delay line 32-1 and fine delay lines 32-2 and 32-3 with regard to the inverted clock CLK1B from the input buffer 1B. In other aspects, operation basically is the same as that of the arrangement shown in FIG. 18.

A third embodiment of the present invention will now be described with reference to FIG. 5, which illustrates the structure of the third embodiment. As shown in FIG. 5, this embodiment is obtained by providing the arrangement of FIG. 20 with latch circuits (aligners) 25, and 39 for latching the tap selection signals from the counters 24, and 34, respectively.

The tCK/2 generating DLL, here designated by a reference numeral 2', is so adapted that the aligner 25 latches the tap selection signal from counter 24 at the rising edge of the output signal CLKHF of delay line 21. According to this embodiment, the latch timing of the aligner 25 is important. By using the rising edge of the output signal CLKHF of delay line 21 for this timing, the tap changeover operation is rendered hazard-free.

Figure 14:
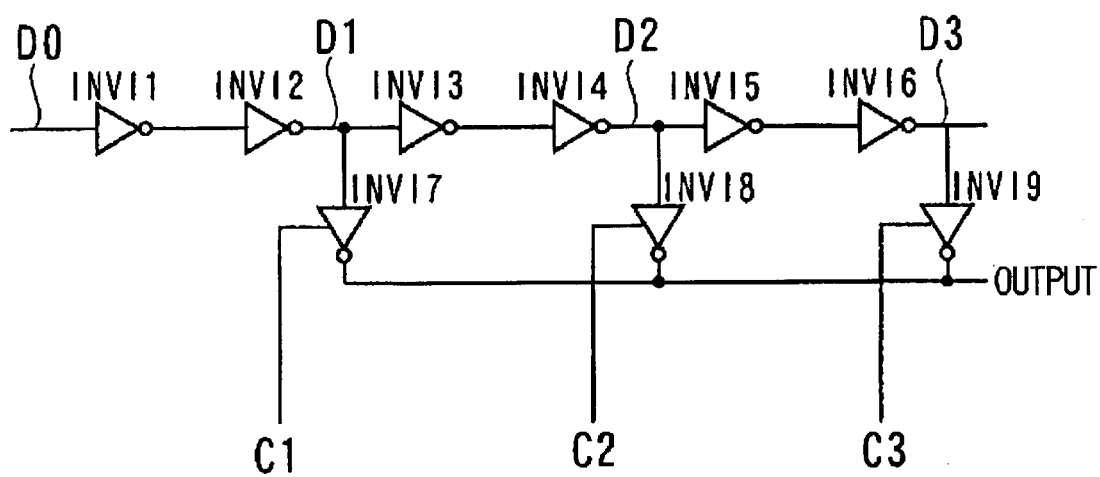
FIG. 14 is a diagram illustrating part of the structure of a delay line.
Figure 15:
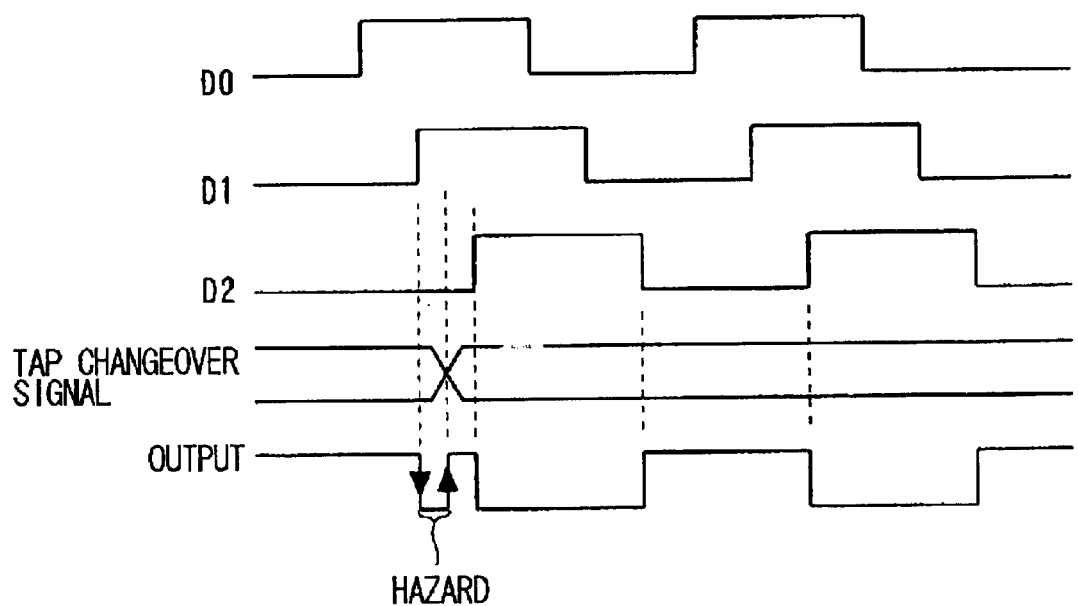
FIG. 15 is a diagram useful in describing occurrence of a hazard at tap changeover in a delay line.
Figure 16:
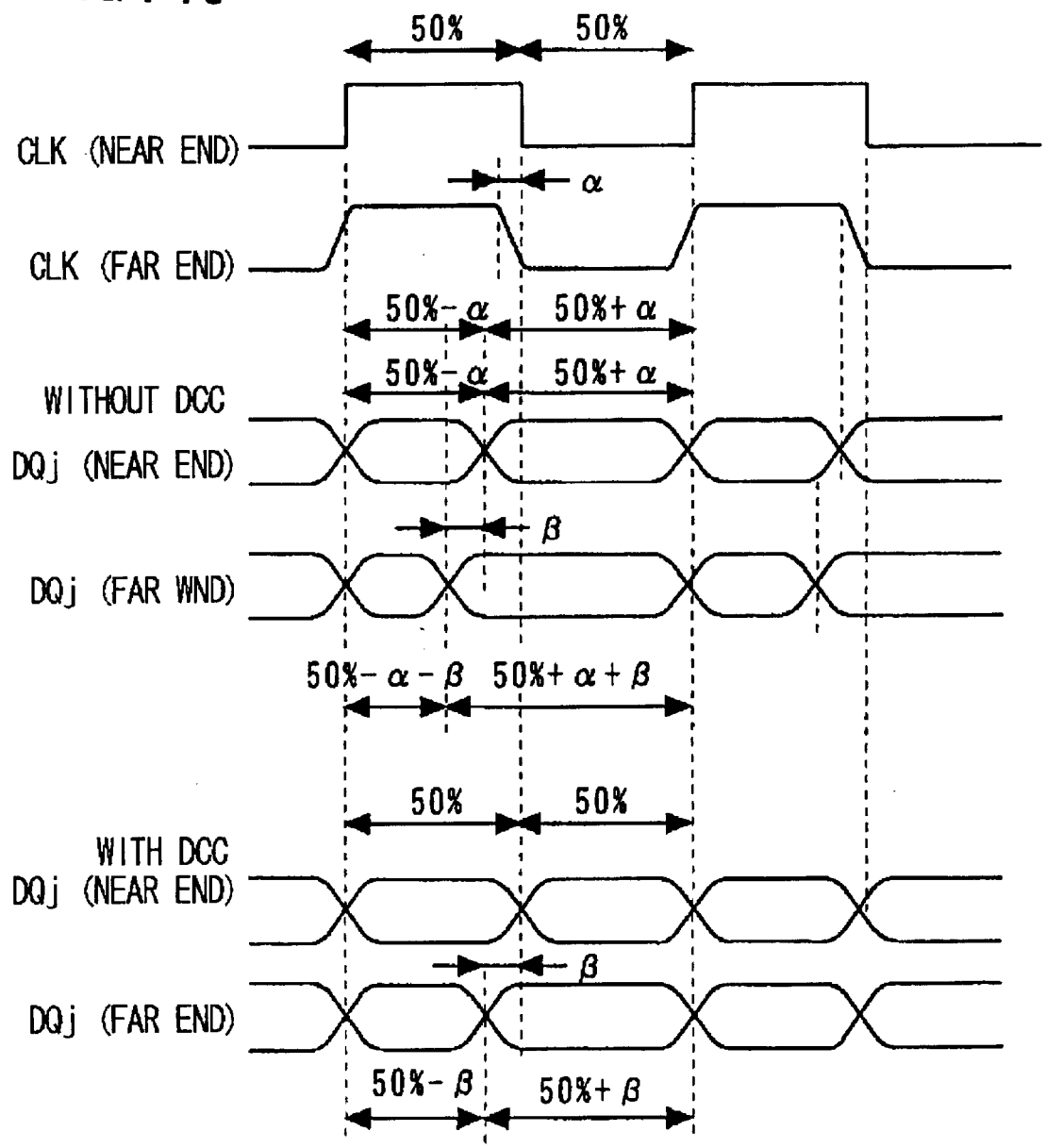
FIG. 16 is a diagram useful in describing the relationship between clock skew and a DCC function in a memory system.
Figure 17:
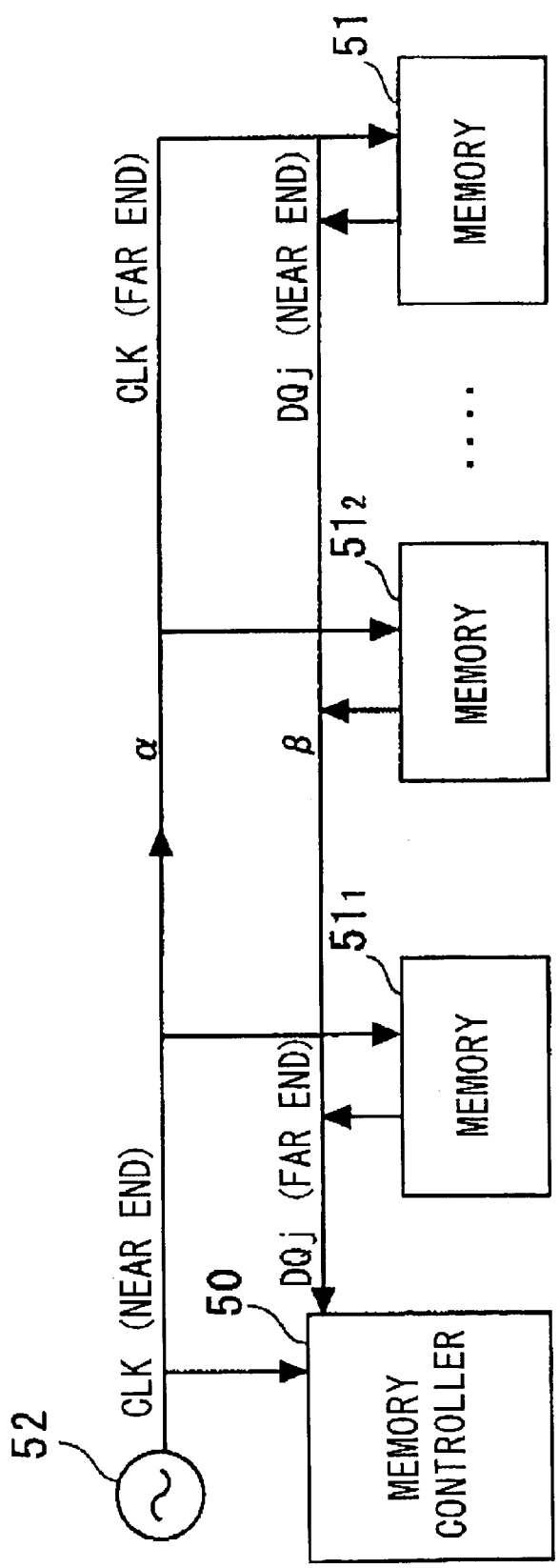
FIG. 17 is a diagram schematically illustrating the configuration of a memory system.

The aligner 25 latches the tap selection signal from the counter 24 at the rising edge of the signal CLKHF, and the taps of the delay lines 21 and 22 are changed over by the latched signal. As a result, a hazard of the kind described above with reference to FIG. 14 will not occur. More specifically, at rise time of the signal CLKHF delivered from the output tap of the delay line 21, a clock pulse that will propagate through the taps (D1~D2) in FIG. 14 does not exist in the delay lines 21 and 22 (this is precisely the instant at which a pulse is output from the tap of delay line 21 and enters the delay line 22). Tap changeover is carried out at this point in time.

The input/output-compensated DLL, here designated by a reference numeral 3', is so adapted that the aligner 39 latches the tap selection signal from counter 34 at the signal CLKOE. The aligner 39 latches the tap selection signal at the rising edge of the output signal CLKOE, and the taps of the delay lines 31 and 32 are changed over by the latched signal. As a result, a hazard of the kind described above with reference to FIGS. 13 and 14 will not occur. More specifically, at rise time of the output signal CLKOE, the signal OUTR is delivered from the delay line 31 and the signal OUTF is delivered later than the signal OUTR. Consequently, a clock pulse that will propagate through the taps does not exist in the delay lines 31 and 32, and it is at this time that tap changeover is performed. With the exception of the aligners 25 and 39, the arrangement of FIG. 5 is similar to that of FIG. 20 and therefore these other components need not be described.

A fourth embodiment of the present invention is as illustrated in FIG. 6 showing the structure thereof. This embodiment is obtained by providing the arrangement of FIG. 18 with the latch circuit (aligner) 39 for latching the tap selection signal from the counter 34.

The input/output-compensated DLL, here designated by a reference numeral 3", is so adapted that the aligner 39 latches the tap selection signal from the counter 34 at the output signal CLKOE of delay line 31.

Figure 7:
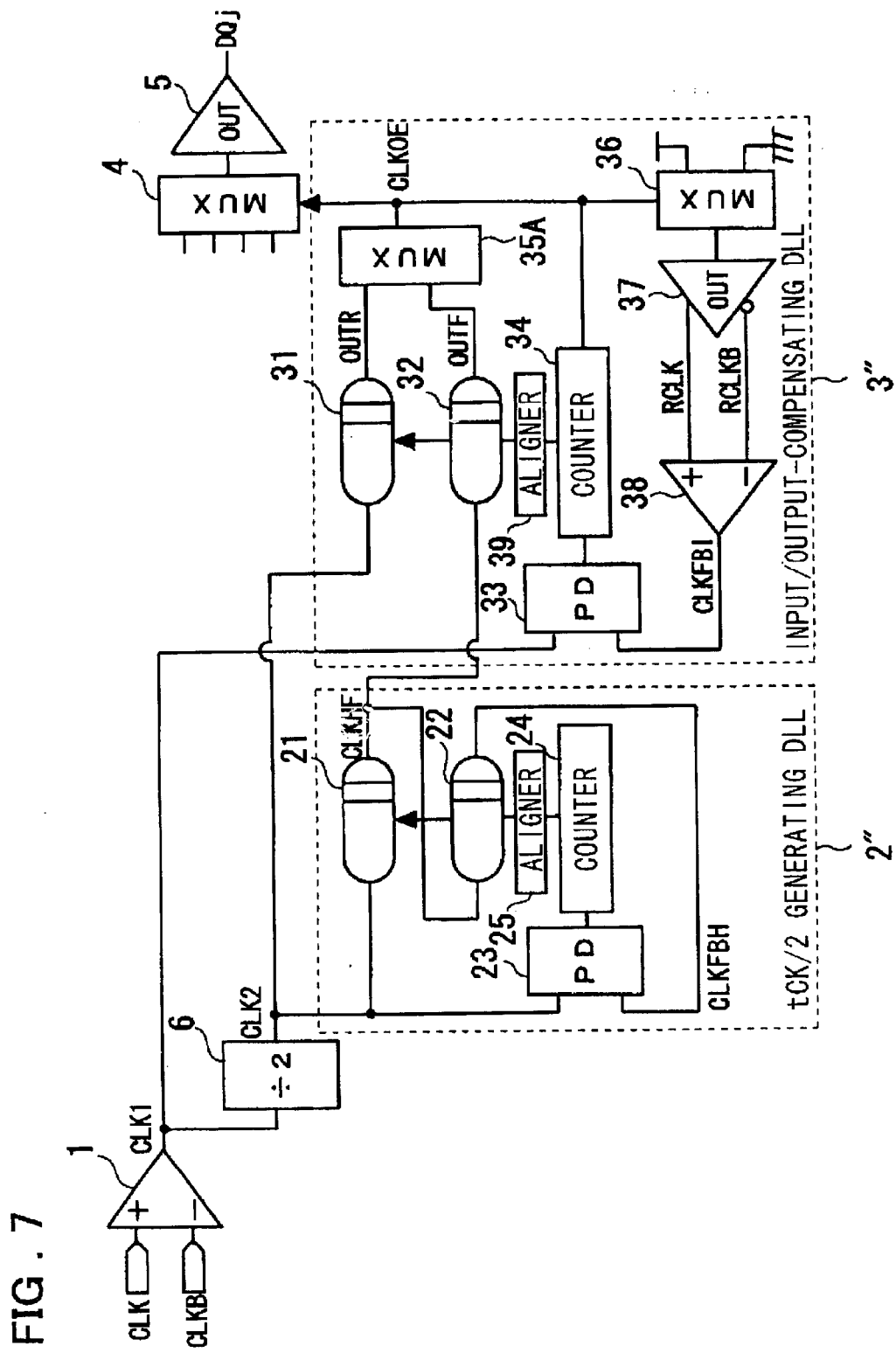
FIG. 7 is a diagram illustrating the structure of a fifth embodiment of the present invention.

A fifth embodiment of the present invention will now be described with reference to FIG. 7, which illustrates the structure of the fifth embodiment. As shown in FIG. 7, this embodiment is obtained by providing the tCK/2 generating DLL 2" and a input/output-compensated DLL 3" in the arrangement of FIG. 1 having the frequency dividing circuit 6 with the latch circuits (aligners) 25 and 39, respectively, for latching the tap selection signals from the counters 24 and 34, respectively. Hazards do not occur at tap changeover of the delay lines 21 and 22, and the delay lines 31 and 32.

Figure 8A:
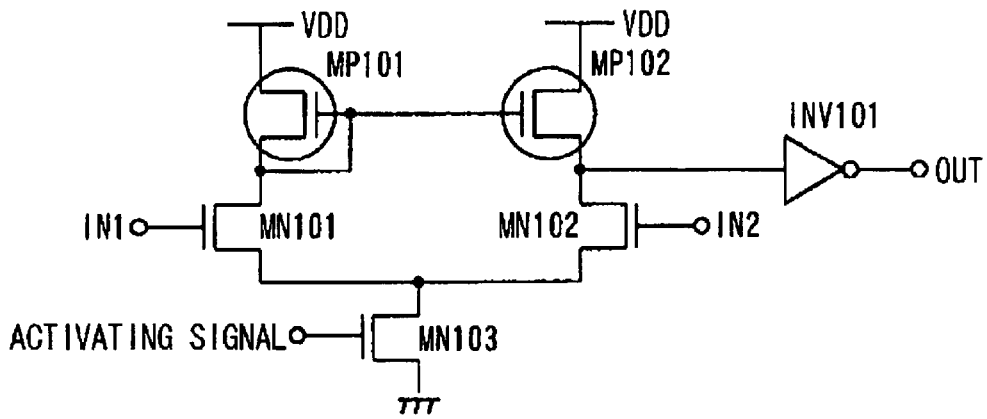
FIGS. 8A and 8B are diagrams illustrating structures of an input buffer used in embodiments of the invention.
Figure 8B:
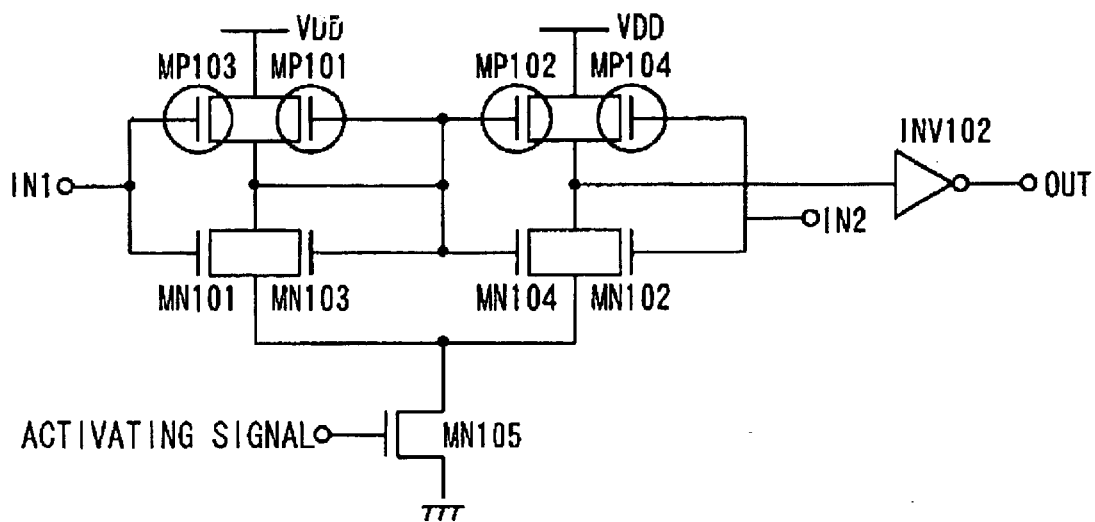

FIGS. 8A and 8B are diagrams illustrating examples of the structure of input buffers 1, 1b in each of the foregoing embodiments.

The input buffer illustrated in FIG. 8A, which is implemented in the form of a differential circuit, includes differential-pair transistors MN101, and MN102 having sources connected in common to an N-channel MOS transistor MN 103 (to the gate terminal of which an activating signal is connected, the signal being turned off in a standby state) serving as a constant-current source, having gates connected to differential input terminals IN1 and IN2, respectively; active loads composed by current mirror circuits MP101 and MP102 connected between drains of the differential-pair transistors MN101 and MN102, respectively, and a power supply VDD; and an inverter INV101 connected to the output terminal of the differential-pair transistors and constructing a buffer that performs a waveshaping operation. Differential clocks CLK, and CLKB are supplied to differential input terminals IN1 and IN2, and the single-ended signal CLK1 is delivered from an output terminal OUT.

The input buffer shown in FIG. 8B is obtained by providing the arrangement of FIG. 8A with two P-channel MOS transistors MP103 and MP104, and two N-channel MOS transistors MN103 and MN104. This input buffer reduces the propagation delay-time difference of the rising and falling edges of the input, assures margin with regard to specifications of window time and is ideal for use in the input receiver circuit of an SDRAM.

Referring to FIG. 8B, the transistors MN103 and MN104 are connected in parallel with respective ones of the transistors MN101 and MN102, composing a differential pair connected to an N-channel MOS transistor MN105, which has an activating signal connected to its gate, and having gates connected to the differential input terminals IN1 and IN2, respectively, and sources that are tied together. The P-channel MOS transistors MP103 and MP104 are connected in parallel with the P-channel MOS transistors MP101 and MP102, respectively, that compose a current mirror. The N-channel MOS transistors MN103 and MN104 have gates connected in common to the drain of the N-channel MOS transistor MN101. The gates of the P-channel MOS transistors MP103 and MP104 are connected to the differential input terminals IN1 and IN2, respectively. The signals CLK, and CLKB are input to the differential input terminals IN1, and IN2, respectively, and the signal CLK1 is delivered from the output terminal OUT. For the details of the structure shown in FIG. 8B, refer to the specification of Japanese Patent No. P3061126.

FIG. 9A is a diagram illustrating an example of the structure of the phase detector 23 (33) shown in FIG. 1.

The phase detector 23 includes an inverter INV201 which receives the frequency-divided clock CLK2; an inverter INV202 which receives the signal CLKFBH; a NAND gate 201 which receives a signal obtained by inverting the frequency-divided clock CLK2 by the inverter INV201 and a signal obtained by inverting the signal CLKFBH by the inverter INV202; a NAND gate 202 which receives a signal obtained by delaying the frequency-divided clock CLK2 by a transfer gate TG1 in the ON state and the signal obtained by inverting the signal CLKFBH by the inverter INV202; an RS flip-flop comprising NAND gates 203 and 204; a NAND gate 205 which receives the output signal of the NAND gate 203 and a signal obtained by inverting the output of the inverter INV202 by an inverter INV203; a NAND gate 206 which receives the output of the NAND gate 204 and the output signal of the inverter INV203; and an RS flip-flop comprising NAND gates 207 and 208. A detection signal UPH is output from the NAND gate 208. In a case where the signal CLKFBI and clock signal CLK1 are compared in the phase detector 33, the output of the NAND gate 207 is used as a detection signal UPI.

The phase comparator of FIG. 9A is adapted to output the detection signal UPI/UPH upon detecting the phase lag/lead relationship of the clock signals CLK1/CLK2 on the input side using the feedback signals CLKFBI/CLKFBH as a reference. In a case where the phase of the rising edge of the frequency-divided clock CLK2 lags behind that of the rising edge of the signal CLKFBH, the signal UPH attains the HIGH level (see FIG. 9C), and the counter 24 (see FIG. 1), which receives this HIGH level, counts up, for example, and outputs tap control signals for changing over the taps of the delay lines 21 and 22 so as to increase the amount of delay in the delay lines 21 and 22 (see FIG. 1). Further, in a case where the phase of the rising edge of the frequency-divided clock CLK2 leads that of the rising edge of signal CLKFBH, the signal UPH falls to the LOW level (see FIG. 9C) and the counter 34 counts down, for example, and outputs tap control signals for changing over the taps of the delay lines 21 and 22 so as to decrease the amount of delay in the delay lines 21 and 22 (see FIG. 1).

In a case where the phase of the falling edge of the clock CLK1 leads that of the rising edge of signal CLKFBI, the signal UPI attains the HIGH level (see FIG. 9B) and the counter 34 (see FIG. 1), which receives this HIGH level, increases the amount of delay in the delay lines 31 and 32 (see FIG. 1). In a case where the phase of the falling edge of the clock CLK1 leads that of the rising edge of signal CLKFBI, the signal UPI falls to the LOW level (see FIG. 9B) and the counter 24 changes over the taps of the delay lines 21 and 22 so as to decrease the amount of delay in the delay lines 21 and 22.

Figure 10A:
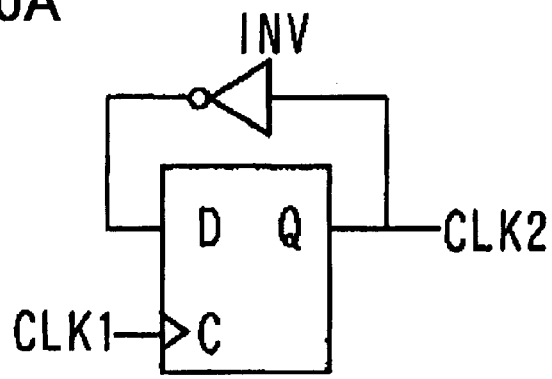
FIGS. 10A and 10B are diagrams illustrating structures of a frequency dividing circuit used in embodiments of the invention.
Figure 10B:
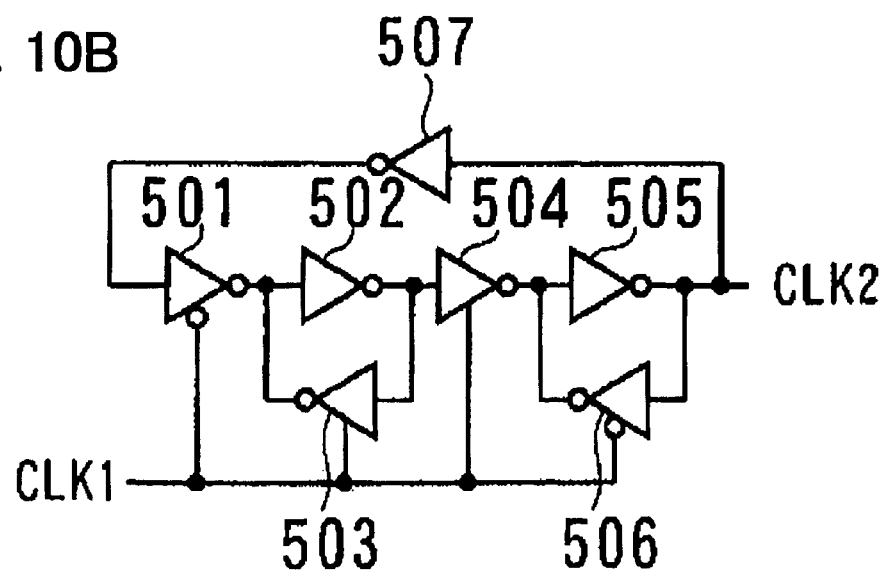

FIGS. 10A and 10B are diagrams illustrating examples of the structure of the frequency dividing circuit 6 in FIG. 1 and frequency dividing circuit 6A in FIG. 3. As shown in FIG. 10A, the divide-by-two frequency dividing circuit comprises a D-type flip-flop and an inverter INV. As illustrated in FIG. 10B, the D-type flip-flop comprises a master latch and a slave latch. The master latch includes a clocked inverter 501 whose output is enabled at the LOW level of clock CLK1; an inverter 502; and a clocked inverter 503 whose output is enabled at the HIGH level of the clock CLK1, and whose input and output terminals are connected to output and input terminals of the inverter 502. The slave latch includes a clocked inverter 504 whose output is enabled at the LOW level of clock CLK1; an inverter 505; and a clocked inverter 506 whose output is enabled at the HIGH level of the clock CLK1 and whose input and output terminals are connected to output and input terminals of the inverter 505. An inverter 507 inverts the output Q of the D-type flip-flop and supplies the inverted signal to a data input terminal D. When the clock signal CLK1 is at the LOW level, the clocked inverter 501 of the master latch turns on and the input signal is output from the inverter 502. When the clock signal CLK1 is at the HIGH level, the clocked inverter 503 of the master latch turns on, the inverters 502, 503, which construct a flip-flop, latch the input signal, the clocked inverter 504 of the slave latch turns on and a signal obtained by inverting the output of the inverter 502 by the inverters 504, 505 is output.

Figure 11A:
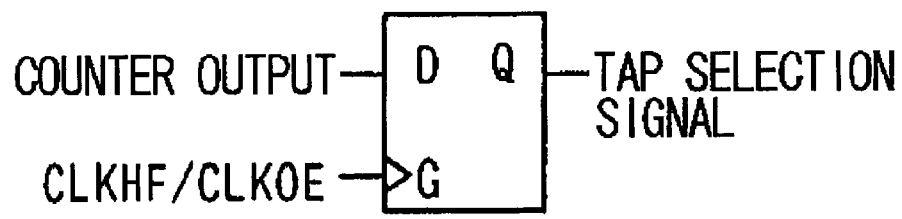
FIGS. 11A and 11B are diagrams illustrating structures of an aligner used in embodiments of the invention.
Figure 11B:
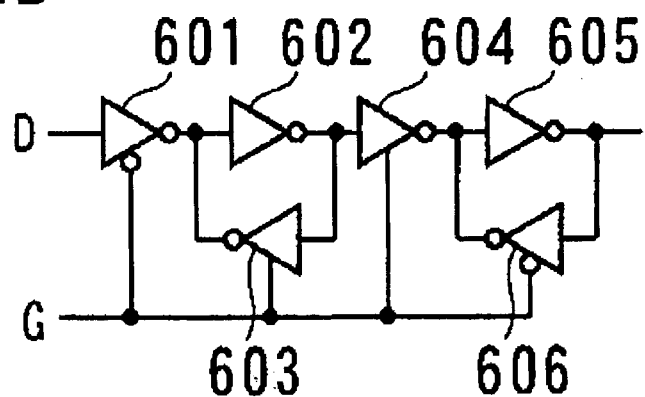

FIGS. 11A and 11B are diagrams illustrating the structure of one bit portion of the aligners 25, and 39 shown in FIGS. 5, 6 and 7. The aligner is implemented by a D-type flip-flop.

FIG. 11B illustrates an example of the structure of a master-slave-type latch circuit (flip-flop) of one bit portion of the aligners 25, and 39 (one bit portion of the counters 24, and 34). This D-type flip-flop latches the counter output at the rising edge of the signal CLKHF/CLKOE. That is, when a signal G (CLKHF/CLKOE) is at the LOW level, a clocked inverter 601 of the master latch turns on and data D (uninverted logic) is output from an inverter 602. When the signal G is at the HIGH level, a clocked inverter 603 in the master latch turns on, the inverters 602, and 603, which compose a flip-flop, latch the data, a clocked inverter 604 of the slave latch turns on and an output signal obtained by inverting the output of the inverter 602 by inverters 604 and 605 is output.

Figure 12:
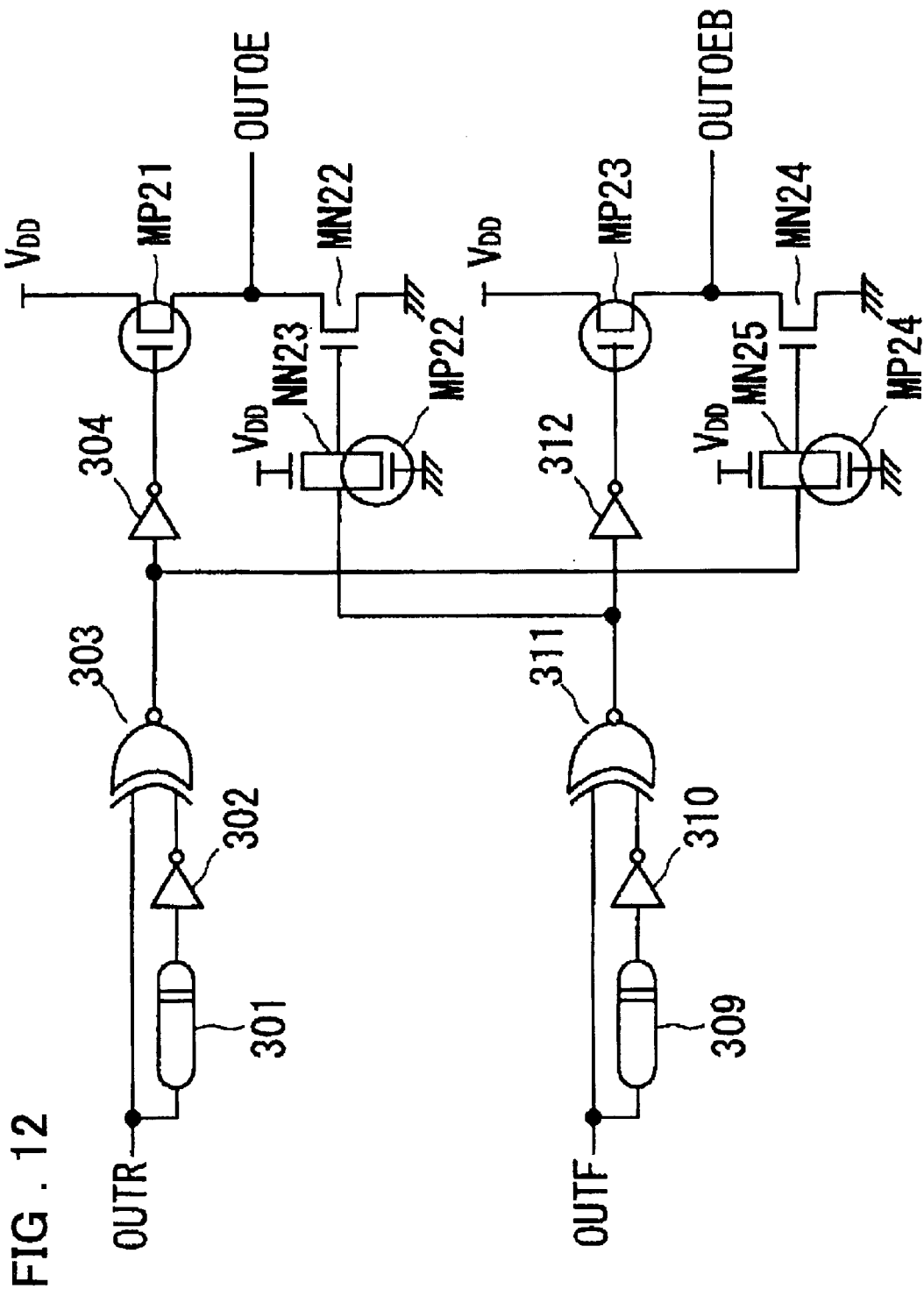
FIG. 12 is a diagram illustrating the structure of a multiplexer used in the first embodiment.

FIG. 12 is a diagram illustrating an example of the structure of the multiplexer 35A shown in FIG. 1. Referring to FIG. 12, the multiplexer includes an exclusive-NOR gate 303 which receives the signal OUTR and a signal obtained by delaying and inverting the signal OUTR by a delay line 301 and inverter 302; an inverter 304 for inverting the output of the exclusive-NOR gate 303; an exclusive-NOR gate 311 which receives the signal OUTF and a signal obtained by delaying and inverting the signal OUTF by a delay line 309 and inverter 310; a P-channel MOS transistor MP21 having a source terminal connected to the power supply VDD and a gate terminal to which the output terminal of the inverter 304 is connected; and an N-channel MOS transistor MN22 having a drain terminal connected to the drain terminal of the P-channel MOS transistor MP21 and a gate terminal to which is input a signal obtained by delaying the output signal of the exclusive-NOR gate 311 by a transfer gate comprising transistors MP22, and MN23. The connection node between the drain terminal of the P-channel MOS transistor MP21 and the drain terminal of the N-channel MOS transistor MN22 is connected to an output terminal OUTOE. It is from this terminal that the clock signal CLKOE (see FIG. 1) for data output is delivered.

The multiplexer further includes a P-channel MOS transistor MP23 having a source terminal connected to the power supply VDD and a gate terminal to which the output of an inverter 312 is connected; and an N-channel MOS transistor MN24 having a drain terminal connected to the drain terminal of the P-channel MOS transistor MP23 and a gate terminal to which is input a signal obtained by delaying the output signal of the exclusive-NOR gate 303 by a transfer gate comprising transistors MP24, and MN25. The connection node between the drain terminal of the P-channel MOS transistor MP23 and the drain terminal of the N-channel MOS transistor MN24 is connected to an output terminal OUTOEB. It is from this terminal that the signal CLKOEB (the complementary signal of CLKOE) is delivered. In a case where the single-ended signal CLKOE and not the signal CLKOEB (the complementary signal of CLKOE) is used, the P-channel MOS transistor MP23, N-channel MOS transistor MN24 and the transfer gate comprising the transistors MP24, and MN24 may be omitted.

The operation of the multiplexer shown in FIG. 12 will now be described. The multiplexer is such that at the rising edge of the signal OUTR, a pulse decided by the total delay time of the delay line 301 and inverter 302 is output from the exclusive-NOR gate 303 and a LOW level pulse signal obtained by inverting this pulse by the inverter 304 is received by the P-channel MOS transistor MP21, whereby the latter is turned on to pull the output terminal OUTOE up to the power supply potential VDD, thereby establishing the HIGH level at this terminal.

Next, at the rising edge of the signal OUTF, a pulse decided by the total delay time of the delay line 309 and inverter 310 is output from the exclusive-NOR gate 311 and a signal obtained by delaying this pulse by the transfer gate is input to the gate terminal of the P-channel MOS transistor MN22, whereby the LOW level is established at the output terminal OUTOE.

Further, at the falling edge of the signal OUTR, the exclusive-NOR gate 303 outputs a pulse having a pulse width equivalent to the total delay time delay line 301 and inverter 302, and a LOW level pulse signal obtained by inverting this pulse by the inverter 304 is input to the P-channel MOS transistor MP21, whereby the latter is turned on to establish the HIGH level at this terminal.

At the falling edge of the signal OUTF, the exclusive-NOR gate 311 outputs a pulse having a pulse width equivalent to the total delay time of delay line 309 and inverter 310, and a signal obtained by delaying this pulse by the transfer gate is input to the gate terminal of the N-channel MOS transistor MN22, whereby the latter is turned on to establish the LOW level at this terminal.

Figure 13:
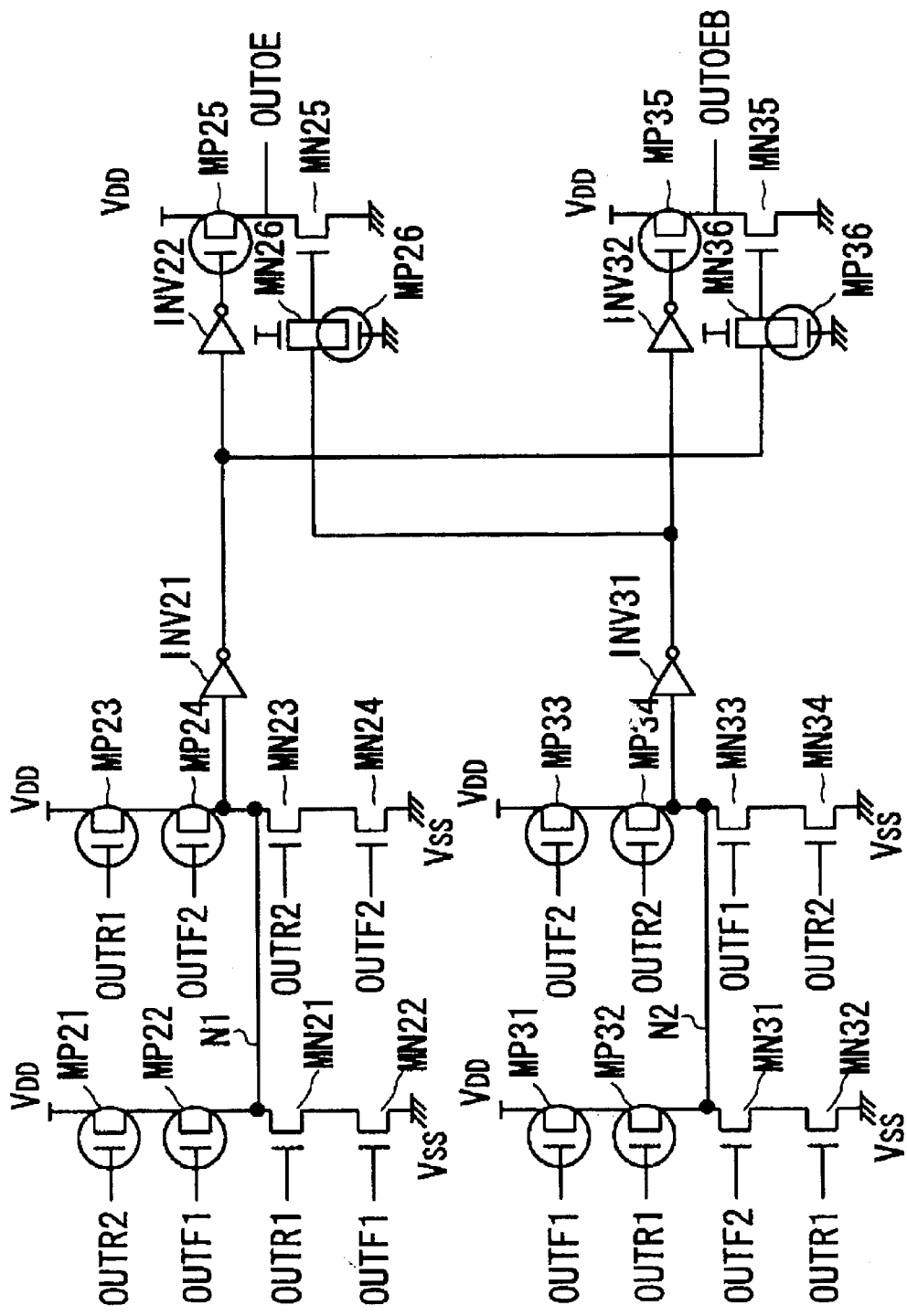
FIG. 13 is a diagram illustrating the structure of a multiplexer used in the second embodiment.

FIG. 13 is a diagram illustrating an example of the structure of the multiplexer 35-1 shown in FIG. 3. Referring to FIG. 13, the multiplexer includes P-channel MOS transistors MP21, MP22 and N-channel MOS transistors MN21, and MN22 serially connected between the power supplys VDD and VSS. Signals OUTR2, OUTF1, OUTR1, and OUTF1 are applied to gate terminals of the P-channel MOS transistors MP21, and MP22, and N-channel MOS transistors MN21, and MN22, respectively.

The multiplexer further includes P-channel MOS transistors MP23, and MP24 and N-channel MOS transistors MN23, and MN24 serially connected between the power supplys VDD and VSS. Signals OUTR1, OUTF2, OUTR2, and OUTF2 are applied to gate terminals of the P-channel MOS transistors MP23, and MP24, and N-channel MOS transistors MN23, and MN24, respectively. A node at which the drain terminal of the P-channel MOS transistor MP22 is connected to the drain of the N-channel MOS transistor MN21 and a node at which the drain terminal of the P-channel MOS transistor MP24 is connected to the drain of the N-channel MOS transistor MN23 are connected to each other and to the input terminal of an inverter INV21.

The multiplexer further includes P-channel MOS transistors MP31, and MP32, and N-channel MOS transistors MN31, and MN32 serially connected between the power supplys VDD and VSS. Signals OUTR1, OUTR1, OUTF2, and OUTR1 are applied to gate terminals of the P-channel MOS transistors MP31 , and MP32 and N-channel MOS transistors MN31, and MN32, respectively.

The multiplexer further includes P-channel MOS transistors MP33, and MP34 and N-channel MOS transistors MN33, and MN34 serially connected between the power supplys VDD and VSS. Signals OUTF2, OUTR2, OUTF1, and OUTR2 are applied to gate terminals of the P-channel MOS transistors MP33, and MP34 and N-channel MOS transistors MN33, and MN34, respectively. A node at which the drain terminal of the P-channel MOS transistor MP32 is connected to the drain of the N-channel MOS transistor MN31 and a node at which the drain terminal of the P-channel MOS transistor MP34 is connected to the drain of the N-channel MOS transistor MN33 are connected to each other and to the input terminal. of an inverter INV31.

The output signal of inverter INV21 is input to the gate terminal of a P-channel MOS transistor MP25, which has a source terminal connected to the power supply VDD, via an inverter INV22, and the output signal of the inverter INV31 is input to the gate terminal of an N-channel MOS transistor MN25, which has a source terminal connected to the power supply VSS, via a transfer gate (comprising transistors MP26, and MN26, which are normally conductive). The drain terminal of the P-channel MOS transistor MP25 and the drain terminal of the N-channel MOS transistor MN25 are tied together and connected to the output terminal OUTOE.

The output signal of inverter INV31 is input to the gate terminal of a P-channel MOS transistor MP35, which has a source terminal connected to the power supply VDD, via an inverter INV32, and the output signal of the inverter INV21 is input to the gate terminal of an N-channel MOS transistor MN35, which has a source terminal connected to the power supply VSS, via a transfer gate (comprising transistors MP36, and MN36, which are normally conductive). The drain terminal of the P-channel MOS transistor MP35 and the drain terminal of the N-channel MOS transistor MN35 are tied together and connected to the output terminal OUTOEB. If the signal CLKOEB that is the complement of the signal CLKOE is not used, the P-channel MOS transistor MP35, N-channel MOS transistor MN35, inverter INV32 and transistors MP36, and MN35 may be deleted.

The operation of the multiplexer shown in FIG. 13 will now be described.

At the rising edge of the signal OUTR1 (signal OUTF1 is at the HIGH level) [see (7) in FIG. 4], the N-channel MOS transistors MN21, and MN22 turn on, node N1 is discharged, the low potential at this node is transmitted via the inverters INV21, and INV22 and applied to the gate terminal of the P-channel MOS transistor MP25, the output terminal OUTOE is charged and the signal CLKOE rises.

At the rising edge of the signal OUTF2 (signal OUTR1 is at the HIGH level) [see (9) in FIG. 4], the N-channel MOS transistors MN31, and MN32 turn on, node N2 is discharged, a signal obtained by inverting the signal at node N2 by the inverter INV31 is transmitted via the transfer gate (MN26, MP26), the HIGH level is applied to the gate terminal of the N-channel MOS transistor MN25, the output terminal OUTOE is discharged and the signal CLKOE falls.

At the rising edge of the signal OUTR2 (signal OUTF2 is at the HIGH level) [see (10) in FIG. 4], the N-channel MOS transistors MN23, and MN24 turn on, node N1 is discharged, the low potential at this node is transmitted via the inverters INV21, and INV22 and applied to the gate terminal of the P-channel MOS transistor MP25, the output terminal OUTOE is charged and the signal CLKOE rises.

At the rising edge of the signal OUTF1 (signal OUTR2 is at the HIGH level) [see (11) in FIG. 4], the N-channel MOS transistors MN33, and MN34 turn on, node N2 is discharged, a signal obtained by inverting the signal at node N2 by the inverter INV31 is transmitted via the transfer gate (MN26, and MP26), a HIGH level is applied to the gate terminal of the N-channel MOS transistor MN25, the output terminal OUTOE is discharged and the signal CLKOE falls.

The node N1 is charged when the signals OUTR2, and OUTF1 are both at the LOW level or when the signals OUTR1, and OUTF2 are both at the LOW level, at which time the P-channel MOS transistor MP25 turns off.

The node N2 is charged when the signals OUTF1, and OUTR1 are both at the LOW level or when the signals OUTF2, and OUTR2 are both at the LOW level, at which time the P-channel MOS transistor MP35 turns off.

The present invention has been described in line with an embodiment in which the invention is applied to a DDR-SDRAM. However, the invention is applicable similarly to any DLL that implements a duty correction function and to a DLL of any application that establishes phase coincidence between an input clock and an output clock. In the above embodiments, the tap selection signals output from the counters 24, and 35 to the delay lines 21 and 22, and delay lines 31 and 32 may be made Grey codes in which only one bit changes at a time.

The present invention is not limited to the structure of the foregoing embodiments and it goes without saying that the invention covers various modifications and changes that would be obvious to those skilled in the art within the scope of the claims.

The meritorious effects of the present invention are summarized as follows.

Thus, in accordance with the present invention as described above, a DLL having a DCC function is implemented using a signal obtained by dividing the frequency of an input clock, thereby reducing power consumption at the time of operation.

In a case where the present invention is applied to a DDR-SDRAM or the like, variation in the duty of a clock signal as caused by clock skew is corrected for while power consumption at the time of operation is reduced. As a result, data can be output at the correct period [e.g., one-half the clock cycle (tCK)].

Furthermore, in accordance with the present invention, occurrence of hazards at tap changeover of delay lines in the DLL is avoided, malfunction is prevented, operation is stabilized and reliability enhanced by providing a circuit for latching a tap selection signal that selects the taps of the delay lines.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed element, matters and/or items might fall under the modifications aforementioned.

What is claimed is:

1. A semiconductor integrated circuit device, comprising:
an input buffer for receiving a clock signal applied thereto;
a frequency dividing circuit, receiving a clock signal output from said input buffer, for performing frequency division of the clock signal to output a frequency-divided clock signal;
a first delay-locked loop circuit including:
a first delay line, receiving the frequency-divided clock signal output from said frequency dividing circuit; for outputting a signal obtained by delaying the frequency-divided clock signal, from an output tap selected front among a plurality of output taps having delay times that differ from one another;
a second delay line, receiving an output signal of said first delay line, for outputting a signal obtained by delaying the output signal of said first delay line, from an output tap selected from among a plurality of output taps having delay times that differ from one another;
a first phase detector, receiving the frequency-divided clock signal output from said frequency-dividing circuit and a signal output from said second delay line, for detecting a phase difference between the two signals; and
a first counter, receiving an output signal from said first phase detector, for changing a count value in accordance with a phase lead/lag relationship represented by the output of said first phase detector and for outputting a tap selection signal that changes over the output taps of said first and second delay lines;
a second delay-locked loop circuit including:
a third delay line, receiving the frequency-divided clock signal output from the frequency dividing circuit, for outputting a signal obtained by delaying the frequency-divided clock signal, from an output tap selected from among a plurality of output taps having delay times that differ from one another;
a fourth delay line, receiving an output signal of said first delay line, for outputting a signal obtained by delaying the output signal of said first delay line, from an output tap selected from among a plurality of output taps having delay times that differ from one another;
a first multiplexer, receiving output signals of said third and fourth delay lines, for outputting a signal in which timings of rising and falling edges of a pulse are decided by rising edges of respective ones of the two output signals, and in which timings of rising and falling edges of a succeeding pulse are decided by falling edges of respective ones the two output signals;
a dummy second multiplexer, receiving the output signal of said first multiplexer;
a dummy first buffer, receiving an output of said second multiplexer, and having a delay time identical with that of an output buffer;
a dummy second buffer, receiving an output of said dummy first buffer, and having a delay time identical with that of said input buffer;
a second phase detector, receiving the clock signal output from said input buffer and a signal output from said dummy second buffer, for detecting a phase difference between the two signals; and
a second counter, receiving an output signal from said second phase detector, for changing a count value in accordance with a phase lead/lag relationship represented by the output of said second phase detector and for outputting a tap selection signal that changes over the output taps of said third and delay lines; and
a third multiplexer, receiving the signal output from said first multiplexer as a data-output clock, for selecting and outputting one item of data among a plurality of items of data applied thereto;
said second multiplexer having a delay time identical with that of said third multiplexer;
said output buffer, receiving a signal output from said third multiplexer, for outputting the signal as output data from an output terminal.

2. The semiconductor integrated circuit device according to claim 1, wherein said first multiplexer includes:
a first signal generating circuit, which receives the output signal of said third delay line, for outputting a pulse signal of a predetermined pulse width at positive- and negative-going transitions of the output signal of said third delay line;

second signal generating circuit, which receives the output signal of said fourth delay line, for outputting a pulse signal of a predetermined pulse width at positive- and negative-going transitions of the output signal of said fourth delay line; and first and second transistors of mutually opposite conductivity types connected serially between a high-potential power supply and a low-potential power supply for producing an output signal from a connection node of the first and second transistors;

wherein a signal obtained by inverting an output signal of said first signal generating circuit is supplied to a control terminal of said first transistor; and a signal obtained by delaying an output signal of said second signal generating circuit is supplied to a control terminal of said second transistor.

3. The semiconductor integrated circuit device according to claim 1, wherein said first delay line includes:
a first coarse delay line;
a first fine delay line, which receives an output signal of said first coarse delay line;
a second fine delay line, which receives a signal obtained by inverting the output signal of said first coarse delay line by an inverter; and
a fourth multiplexer, which receives output signals of said first fine delay line and said second fine delay line, for synthesizing a single-ended signal; and wherein
said second delay line includes:
a second coarse delay line;
a third fine delay line, which receives an output signal of said second coarse delay line;
a fourth fine delay line, which receives a signal obtained by inverting the output signal of said second coarse delay line by an inverter; and
a fifth multiplexer, which receives output signals of said third fine delay line and said fourth fine delay line, for synthesizing a single-ended signal.

4. The semiconductor integrated circuit device according to claim 1, wherein said third delay line includes:
a third coarse delay line;
a fifth fine delay line, which receives an output signal of said third coarse delay line; and
a sixth fine delay line, which receives a signal obtained by inverting the output signal of said third coarse delay line by an inverter;
wherein said fourth delay line includes:
a fourth coarse delay line;
a seventh fine delay line, which receives an output signal of said fourth coarse delay line; and
an eighth fine delay line, which receives a signal obtained by inverting the output signal of said fourth coarse delay line by an inverter; and wherein
said first multiplexer, which receives first to fourth delayed signals output from said fifth to eighth fine delay lines, respectively, outputs a signal of which timings of rising and falling edges thereof are decided by rising edges of respective ones of the first and fourth delayed signals, and outputs a signal of which timings of rising and falling edges thereof are decided by rising edges of respective ones of the second and third delayed signals.

5. The semiconductor integrated circuit device according to claim 1, further comprising a first aligner, which receives the signal output from said first delay line as a latch timing signal, for latching the tap selection signal output from said first counter and supplying the latched signal to said first and second delay lines.

6. The semiconductor integrated circuit device according to claim 1, further comprising a second aligner, which receives the output signal of said first multiplexer as a latch timing signal, for latching the tap selection signal output from said second counter and supplying the latched signal to said third and fourth delay lines.

7. The semiconductor integrated circuit device according to claim 1, further comprising a first changeover switch for selecting either the clock signal from said input buffer or the frequency-divided clock from said frequency dividing circuit and supplying the selected signal to said first delay line and said first phase detector.

8. The semiconductor integrated circuit device according to claim 1, further comprising:
a second input buffer for generating a second clock signal that is a complementary signal of the clock signal output from said input buffer;
a second frequency dividing circuit for performing frequency division of the clock signal from said second input buffer and outputting a frequency-divided clock; and
a second changeover switch for selecting either the clock signal from said second input buffer or the frequency-divided clock from said second frequency dividing circuit and supplying the selected signal to said fourth delay line.

9. The semiconductor integrated circuit device according to claim 1, wherein said first phase detector detects phase lag/lead of the frequency-divided clock using the output signal of said second delay line as a reference; and wherein
said second phase detector detects phase lag/lead of the clock signal, which is output from said input buffer, using the signal output from said dummy second buffer as a reference.

10. The semiconductor integrated circuit device according to claim 1, wherein said frequency dividing circuit is a divide-by-two frequency dividing circuit for outputting a signal having a frequency obtained by halving the frequency of the signal input thereto.

11. A semiconductor integrated circuit device, comprising:
an input buffer for receiving a clock signal applied thereto;
a first delay-locked loop circuit including:
a first delay line, receiving the clock signal output from said input buffer, for outputting a signal, obtained by delaying the clock signal from said input buffer, from an output tap selected from among a plurality of output taps having delay times that differ from one another;
a second delay line, receiving an output signal of said first delay line, for outputting a signal obtained by delaying the output signal of said first delay line, from an output tap selected from among a plurality of output taps having delay times that differ from one another;
a first phase detector, receiving the clock signal output from said input buffer and the signal output from said second delay line, for detecting a phase difference between the two signals;
a first counter, receiving an output signal from said first phase detector, for changing a count value in accordance with a phase lead/lag relationship represented by the output of said first phase detector and for outputting a tap selection signal that changes over the output taps of said first and second delay lines; and a first aligner, receiving the signal output from said first delay line as a latch timing signal, for latching the tap selection signal output from said first counter and supplying the latched signal to said first and second delay lines;

a second delay-locked loop circuit including:

a third delay line, receiving the clock signal output from said first input buffer, for outputting a signal obtained by delaying the clock signal from said input buffer, from an output tap selected from among a plurality of output taps having delay times that differ from one another;

a fourth delay line, receiving an output signal of said first delay line, for outputting a signal obtained by delaying the output signal of said first delay line, from an output tap selected from among a plurality of output taps having delay times that differ from one another;

a first multiplexer, receiving two output signals of said third and fourth delay lines, for outputting a signal in which timings of rising and falling edges of a pulse are decided by rising edges of respective ones of the two output signals, and in which timings of rising and falling edges of a succeeding pulse are decided by falling edges of respective ones the two output signals;

a dummy second multiplexer, receiving the output signal of said first multiplexer;

a dummy first buffer, receiving an output signal of said second multiplexer and having a delay time identical with that of an output buffer;

a dummy second buffer, receiving an output signal of said dummy first buffer and having a delay time identical with that of said input buffer;

a second phase detector, receiving the clock signal output from said input buffer and a signal output from said dummy second buffer, for detecting a phase difference between the two signals;

a second counter, receiving an output signal from said second phase detector, for changing a count value in accordance with a phase lead/lag relationship represented by the output of said second phase detector and for outputting a tap selection signal that changes over the output taps of said third and delay lines; and a second aligner, receiving the output signal of said first multiplexer as a latch timing signal, for latching the tap selection signal that is output from said second counter and supplying this signal to said third and fourth delay lines; and a third multiplexer, receiving the signal output from said first multiplexer as a data-output clock, for selecting and outputting one item of data among a plurality of items of data applied thereto;

said second multiplexer having a delay time identical with that of said third multiplexer;

said output buffer, receiving a signal output from said third multiplexer, outputting the signal as output data from an output terminal.

12. The semiconductor integrated circuit device according to claim 11, wherein said first phase detector detects phase lag/lead of the clock signal, which is output from said input buffer, using the output signal of said second delay line as a reference; and wherein said second phase detector detects phase lag/lead of the clock signal, which is output from said input buffer, using the signal output from said dummy second buffer as a reference.

13. The semiconductor integrated circuit device according to claim 11, wherein said first multiplexer includes:

a first signal generating circuit, which receives the output signal of said third delay line, for outputting a pulse signal of a predetermined pulse width at positive- and negative-going transitions of the output signal of said third delay line;

a second signal generating circuit, which receives the output signal of said fourth delay line, for outputting a pulse signal of a predetermined pulse width at positive- and negative-going transitions of the output signal of said fourth delay line; and first and second transistors of mutually opposite conductivity types connected serially between a high-potential power supply and a low-potential power supply for producing an output signal from a connection node of the first and second transistors;

wherein a signal obtained by inverting an output signal of said first signal generating circuit is supplied to a control terminal of said first transistor; and a signal obtained by delaying an output signal of said second signal generating circuit is supplied to a control terminal of said second transistor.

14. The semiconductor integrated circuit device according to claim 11, wherein said first delay line includes:

a first coarse delay line;

a first fine delay line, which receives an output signal of said first coarse delay line;

a second fine delay line, which receives a signal obtained by inverting the output signal of said first coarse delay line by an inverter; and a fourth multiplexer, which receives output signals of said first fine delay line and said second fine delay line, for synthesizing a single-ended signal; and wherein said second delay line includes:

a second coarse delay line;

a third fine delay line, which receives an output signal of said second coarse delay line;

a fourth fine delay line, which receives a signal obtained by inverting the output signal of said second coarse delay line by an inverter; and a fifth multiplexer, which receives output signals of said third fine delay line and said fourth fine delay line, for synthesizing a single-ended signal.

15. The semiconductor integrated circuit device according to claim 11, wherein said third delay line includes:

a third coarse delay line;

a fifth fine delay line, which receives an output signal of said third coarse delay line; and a sixth fine delay line, which receives a signal obtained by inverting the output signal of said third coarse delay line by an inverter;

wherein said fourth delay line includes:

a fourth coarse delay line;

a seventh fine delay line, which receives an output signal of said fourth coarse delay line; and an eighth fine delay line, which receives a signal obtained by inverting the output signal of said fourth coarse delay line by an inverter; and wherein said first multiplexer, which receives first to fourth delayed signals output from said fifth to eighth fine delay lines, respectively, outputs a signal of which timings of rising and falling edges thereof are decided by rising edges of respective ones of the first and fourth delayed signals, and outputs a signal of which timings of rising and falling edges thereof are decided by rising edges of respective ones of the second and third delayed signals.

16. A semiconductor integrated circuit device, comprising:
- an input buffer for receiving a clock signal applied thereto;
- a delay-locked loop circuit including:
  - a delay line, receiving the clock signal output from said input buffer, for outputting a signal obtained by delaying the clock signal from said input buffer, from an output tap selected from among a plurality of output taps having delay times that differ from one another;
  - a first multiplexer, receiving the output signal of said delay line;
  - a dummy first buffer, receiving an output signal of said first multiplexer and having a delay time identical with that of an output buffer;
  - a dummy second buffer, receiving an output signal of first buffer and having a delay time identical with that of said input buffer;
  - a phase detector, receiving the clock signal output from said input buffer and an output signal of said dummy second buffer, for detecting a phase difference between the two signals;
  - a counter, receiving an output signal from said phase detector, for changing a count value in accordance with a phase lead/lag relationship represented by the output of said phase detector and for outputting a tap selection signal that changes over the output tap of said delay line; and
  - an aligner, receiving the output signal of said delay line as a latch timing signal, for latching the tap selection signal output from said counter and supplying the latched signal to said delay line; and
  - a second multiplexer, receiving the signal output from said delay line as a data-output clock, for selecting and outputting one item of data among a plurality of items of data applied thereto;
  - said first multiplexer having a delay time identical with that of said second multiplexer;
  - said output buffer, receiving a signal output from said second multiplexer, outputting the signal as output data from an output terminal.

17. The semiconductor integrated circuit device according to claim 16, wherein said phase detector detects phase lag/lead of the clock signal, which is output from said input buffer, using the signal output from said dummy second buffer as a reference.

18. A delay-locked loop device comprising:
- a first delay-locked loop for adjusting delay times of serially connected first and second delay lines in such a manner that a signal obtained by delaying an input signal by the first and second delay lines is in phase with the input signal, thereby outputting, from the first delay line, a signal that is the result of delaying the input signal by one half cycle of the input signal, said first delay-locked loop including:
  - a frequency dividing circuit for performing frequency division of the input signal, an output signal from said frequency dividing circuit being delayed by said first and second delay lines; and
  - first delay adjustment means for outputting a control signal for adjusting the delay times of said first and second delay lines in such a manner that the output signal of said frequency dividing circuit and an output signal of said second delay line are in phase; and
- a second delay-locked loop for generating a data-output clock signal based upon the input signal and supplying the data-output clock to a multiplexer that selectively outputs multiple items of data, said second delay-locked loop including:
  - a third delay line, receiving the output signal of said frequency dividing circuit, for outputting a first signal by delaying this output signal;
  - a fourth delay line, receiving an output signal of said first delay-locked loop device, for outputting a second signal by delaying this output signal;
  - a circuit, receiving the first and second signals from said third and fourth delay lines, respectively, for outputting, as the data-output clock, a signal in which timings of rising and falling edges of a pulse are decided by rising edges of respective ones of the first and second signals, and in which timings of rising and falling edges of a succeeding pulse are decided by falling edges of respective ones of the first and second signals; and
  - second delay adjusting means for outputting a control signal for adjusting delay times of said third and fourth delay lines in such a manner that a signal obtained by delaying the data-output clock by at least a delay time of said multiplexer is in phase with the input signal.

19. The delay-locked loop device according to claim 18, further comprising a second latch circuit for supplying the control signal from said second delay adjusting means to said third and fourth delay lines upon latching the control signal from said second delay adjustment means by the data-output clock.

20. The delay-locked loop device according to claim 18, further comprising a first latch circuit for supplying the control signal from said first delay adjusting means to said first and second delay lines upon latching the control signal from said first delay adjustment means by the output signal of said first delay line.

21. A delay-locked loop device for adjusting delay times of serially connected first and second delay lines in such a manner that a signal obtained by delaying an input signal by the first and second delay lines is in phase with the input signal, thereby outputting, from the first delay line, a signal that is the result of delaying the input signal by one half cycle of the input signal, comprising:
- a frequency dividing circuit for performing frequency division of the input signal, an output signal from said frequency dividing circuit being delayed by said first and second delay lines;
- first delay adjustment means for outputting a control signal for adjusting the delay times of said first and second delay lines in such a manner that the output signal of said frequency dividing circuit and an output signal of said second delay line are in phase; and
- a first latch circuit for supplying the control signal from said first delay adjusting means to said first and second delay lines upon latching the control signal from said first delay adjustment means by the output signal of said first delay line.

22. A delay-locked loop device comprising a first delay-locked loop and a second delay-locked loop;

said first delay-locked loop including:
a first delay line receiving a clock signal obtained as a result of dividing a frequency of a clock signal output from an input buffer, using a frequency divider, for outputting a signal obtained by delaying the frequency-divided clock signal, from an output tap selected from among a plurality of output taps having delay times that differ from one another;
a second delay line, receiving an output signal of said first delay line, for outputting a signal obtained by delaying the output signal of said first delay line, from an output tap selected from among a plurality of output taps having delay times that differ from one another;
a first phase detector, receiving the frequency-divided clock signal and a signal output from said second delay line, for detecting a phase difference between the two signals; and
a first counter, receiving an output signal from said first phase detector, for changing a count value in accordance with a phase lead/lag relationship represented by the output of said first phase detector and for outputting a tap selection signal that changes over the output taps of said first and second delay lines; and
said second delay-locked loop including:
a third delay line, receiving the frequency-divided clock signal output from said frequency dividing circuit, for outputting a signal obtained by delaying the frequency-divided clock signal, from an output tap selected from among a plurality of output taps having delay times that differ from one another;
a fourth delay line, receiving an output signal of said first delay line, for outputting a signal obtained by delaying the output signal of said first delay line, from an output tap selected from among a plurality of output taps having delay times that differ from one another;
a first multiplexer, receiving output signals of said third and fourth delay lines, for outputting a signal in which timings of rising and falling edges of a pulse are decided by rising edges of respective ones of the two output signals, and in which timings of rising and falling edges of a succeeding pulse are decided by falling edges of respective ones the two output signals;
delay means for delaying the signal output from said first multiplexer a predetermined length of time;
a second phase detector, receiving the clock signal output from said input buffer and an output signal of said delay means, for detecting a phase difference between the two signals; and
a second counter, receiving an output signal from said second phase detector, for changing a count value in accordance with a phase lead/lag relationship represented by the output of said second phase detector and for outputting a tap selection signal that changes over the output taps of said third and fourth delay lines.

23. The delay-locked loop device according to claim 22, wherein said first multiplexer includes:
a first signal generating circuit, receiving the output signal of said third delay line, for outputting a pulse signal of a predetermined pulse width at positive- and negative-going transitions of the output signal of said third delay line;
a second signal generating circuit, receiving the output signal of said fourth delay line, for outputting a pulse signal of a predetermined pulse width at positive- and negative-going transitions of the output signal of said fourth delay line; and
first and second transistors of mutually opposite conductivity types connected serially between a high-potential power supply and a low-potential power supply for producing an output signal from a connection node of first and second transistors;
wherein a signal obtained by inverting an output signal of said first signal generating circuit is supplied to a control terminal of said first transistor; and wherein
a signal obtained by delaying an output signal of said second signal generating circuit is supplied to a control terminal of said second transistor.

24. The delay-locked loop device according to claim 22, wherein said first delay line includes:
a first coarse delay line;
a first fine delay line, receiving an output signal of said first coarse delay line;
a second fine delay line, receiving a signal obtained by inverting the output signal of said first coarse delay line by an inverter; and
a fourth multiplexer, receiving output signals of said first fine delay line and said second fine delay line, for synthesizing a single-ended signal; and wherein
said second delay line includes:
a second coarse delay line;
a third fine delay line, receiving an output signal of said second coarse delay line;
a fourth fine delay line, receiving a signal obtained by inverting the output signal of said second coarse delay line by an inverter; and
a fifth multiplexer, receiving output signals of said third fine delay line and said fourth fine delay line, for synthesizing a single-ended signal.

25. The delay-locked loop device according to claim 22, wherein said third delay line includes:
a third coarse delay line;
a fifth fine delay line, receiving an output signal of said third coarse delay line; and
a sixth fine delay line, receiving a signal obtained by inverting the output signal of said third coarse delay line by an inverter;
wherein said fourth delay line includes:
a fourth coarse delay line;
a seventh fine delay line, receiving an output signal of said fourth coarse delay line; and
a eighth fine delay line, receiving a signal obtained by inverting the output signal of said fourth coarse delay line by an inverter; and wherein
said first multiplexer, receiving first to fourth delayed signals output from said fifth to eighth fine delay lines, respectively, outputs a signal of which timings of rising and falling edges thereof are decided by rising edges of respective ones of the first and fourth delayed signals, and outputs a signal of which timings of rising and falling edges thereof are decided by rising edges of respective ones of the second and third delayed signals.

26. The delay-locked loop device according to claim 22, further comprising a first aligner, which receives the signal output from said first delay line as a latch timing signal, for latching the tap selection signal that is output from said first counter and supplying this signal to said first and second delay lines.

27. The delay-locked loop device according to claim 22, further comprising a second aligner, which receives the output signal of said first multiplexer as a latch timing signal, for latching the tap selection signal that is output from said second counter and supplying this signal to said third and fourth delay lines.

28. The delay-locked loop device according to claim 22, wherein said frequency dividing circuit is a divide-by-two frequency dividing circuit for outputting a signal having a frequency obtained by halving the frequency of the signal input thereto.

29. A delay-locked loop device comprising a first delay-locked loop and a second delay-locked loop;

said first delay-locked loop including:
a first delay line, receiving a clock signal output from an input buffer having the clock signal applied thereto, for outputting a signal obtained by delaying the clock signal from the input buffer, from an output tap selected from among a plurality of output taps having delay times that differ from one another;
a second delay line, receiving an output signal of said first delay line, for outputting a signal obtained by delaying the output signal of said first delay line, from an output tap selected from among a plurality of output taps having delay times that differ from one another;
a first phase detector, receiving the output clock signal of the input buffer and a signal output from said second delay line, for detecting a phase difference between the two signals;
a first counter, receiving an output signal from said first phase detector, for changing a count value in accordance with a phase lead/lag relationship represented by the output of said first phase detector and for outputting a tap selection signal that changes over the output taps of said first and second delay lines; and
a first aligner, receiving the output signal of said first delay line as a latch timing signal, for latching the tap selection signal output from said first counter, and supplying the latched signal to said first and second delay lines; and said second delay-locked loop including:
a third delay line, receiving the clock signal output from the input buffer, for outputting a signal obtained by delaying the clock signal from the input buffer, from an output tap selected from among a plurality of output taps having delay times that differ from one another;
a fourth delay line, receiving an output signal of said first delay line, for outputting a signal obtained by delaying the output signal of said first delay line, from an output tap selected from among a plurality of output taps having delay times that differ from one another;
a first multiplexer, receiving output signals of said third and fourth delay lines, for outputting a signal in which timings of rising and falling edges of a pulse are decided by rising edges of respective ones of the two output signals, and in which timings of rising and falling edges of a succeeding pulse are decided by falling edges of respective ones the two output signals;
delay means for delaying the signal output from said first multiplexer a predetermined length of time;
a second phase detector, receiving the clock signal output from said input buffer and an output signal of said delay means, for detecting a phase difference between the two signals;
a second counter, receiving an output signal from said second phase detector, for changing a count value in accordance with a phase lead/lag relationship represented by the output of said second phase detector and for outputting a tap selection signal that changes over the output taps of said third and fourth delay lines; and
a second aligner, receiving the output signal of said first multiplexer as a latch timing signal, for latching the tap selection signal output from said second counter, and supplying this signal to said third and fourth delay lines.

30. The delay-locked loop device according to claim 29, wherein said first multiplexer includes:
a first signal generating circuit, receiving the output signal of said third delay line, for outputting a pulse signal of a predetermined pulse width at positive- and negative-going transitions of the output signal of said third delay line;
a second signal generating circuit, receiving the output signal of said fourth delay line, for outputting a pulse signal of a predetermined pulse width at positive- and negative-going transitions of the output signal of said fourth delay line; and
first and second transistors of mutually opposite conductivity types connected serially between a high-potential power supply and a low-potential power supply for producing an output signal from a connection node of first and second transistors;
wherein a signal obtained by inverting an output signal of said first signal generating circuit is supplied to a control terminal of said first transistor; and wherein
a signal obtained by delaying an output signal of said second signal generating circuit is supplied to a control terminal of said second transistor.

31. The delay-locked loop device according to claim 29, wherein said first delay line includes:
a first coarse delay line;
a first fine delay line, receiving an output signal of said first coarse delay line;
a second fine delay line, receiving a signal obtained by inverting the output signal of said first coarse delay line by an inverter; and
a fourth multiplexer, receiving output signals of said first fine delay line and said second fine delay line, for synthesizing a single-ended signal; and wherein
said second delay line includes:
a second coarse delay line;
a third fine delay line, receiving an output signal of said second coarse delay line;
a fourth fine delay line, receiving a signal obtained by inverting the output signal of said second coarse delay line by an inverter; and
a fifth multiplexer, receiving output signals of said third fine delay line and said fourth fine delay line, for synthesizing a single-ended signal.

32. The delay-locked loop device according to claim 29, wherein said third delay line includes:
a third coarse delay line;
a fifth fine delay line, receiving an output signal of said third coarse delay line; and
a sixth fine delay line, receiving a signal obtained by inverting the output signal of said third coarse delay line by an inverter;

wherein said fourth delay line includes:
  a fourth coarse delay line;
  a seventh fine delay line, receiving an output signal of said fourth coarse delay line; and
  a eighth fine delay line, receiving a signal obtained by inverting the output signal of said fourth coarse delay line by an inverter; and wherein
  said first multiplexer, receiving first to fourth delayed signals output from said fifth to eight fine delay lines, respectively, outputs a signal of which timings of rising and falling edges thereof are decided by rising edges of respective ones of the first and fourth delayed signals, and outputs a signal of which timings of rising and falling edges thereof are decided by rising edges of respective ones of the second and third delayed signals.

33. A delay-locked loop device comprising:
a delay line, receiving a clock signal that is output from an input buffer having the clock signal applied thereto, for outputting a signal obtained by delaying the clock signal from said input buffer, from an output tap selected from among a plurality of output taps having delay times that differ from one another;

delay means for delaying the signal output from said delay line a predetermined length of time;

a phase detector, receiving the clock signal output from said input buffer and an output signal of said delay means, for detecting a phase difference between the two signals; and a counter, receiving an output signal from said phase detector, for changing a count value in accordance with a phase lead/lag relationship represented by the output of said phase detector and for outputting a tap selection signal that changes over the output tap of said delay line; and an aligner, receiving the signal output from said delay line as a latch timing signal, for latching the tap selection signal that is output from said first counter and supplying this signal to said delay line.

* * * * *